(12) United States Patent
Bazan et al.

(10) Patent No.: US 8,723,169 B2
(45) Date of Patent: May 13, 2014

(54) ENHANCING PERFORMING CHARACTERISTICS OF ORGANIC SEMICONDUCTING FILMS BY IMPROVED SOLUTION PROCESSING

(71) Applicant: The Regents of the University of California, Oakland, CA (US)

(72) Inventors: Guillermo C. Bazan, Goleta, CA (US); Daniel Moses, Santa Barbara, CA (US); Jeffrey Peet, Goleta, CA (US); Alan J. Heeger, Santa Barbara, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 13/669,314

(22) Filed: Nov. 5, 2012

(65) Prior Publication Data

US 2013/0240845 A1    Sep. 19, 2013

Related U.S. Application Data

(63) Continuation of application No. 11/949,705, filed on Dec. 3, 2007, now Pat. No. 8,318,532.

(60) Provisional application No. 60/872,221, filed on Dec. 1, 2006, provisional application No. 60/919,602, filed on Mar. 23, 2007, provisional application No. 60/938,433, filed on May 16, 2007.

(51) Int. Cl.
*H01L 35/24* (2006.01)

(52) U.S. Cl.
USPC ................. 257/40; 257/E51.001; 438/99

(58) Field of Classification Search
USPC ............................ 257/40, E51.001; 438/99
See application file for complete search history.

(56) References Cited

U.S. PATENT DOCUMENTS

| 5,514,878 | A  | 5/1996  | Holmes         |
|-----------|----|---------|----------------|
| 5,986,206 | A  | 11/1999 | Kambe et al.   |
| 6,188,175 | B1 | 2/2001  | May et al.     |
| 6,559,375 | B1 | 5/2003  | Meissner et al.|
| 6,683,244 | B2 | 1/2004  | Fujimori et al.|
| 6,891,191 | B2 | 5/2005  | Xiao et al.    |
| 6,946,597 | B2 | 9/2005  | Sager et al.   |
| 7,045,205 | B1 | 5/2006  | Sager          |

(Continued)

FOREIGN PATENT DOCUMENTS

| EP | 1 447 860 A1 | 8/2004 |
|----|--------------|--------|
| EP | 1 691 428 A2 | 8/2006 |

(Continued)

OTHER PUBLICATIONS

Brabec, C.J. (Feb. 2001). "Plastic Solar Cells," *Advanced Functional Materials* 11(1):15-26.

(Continued)

*Primary Examiner* — Anthony Ho
(74) *Attorney, Agent, or Firm* — Morrison & Foerster LLP

(57) ABSTRACT

Improved processing methods for enhanced properties of conjugated polymer films are disclosed, as well as the enhanced conjugated polymer films produced thereby. Addition of low molecular weight alkyl-containing molecules to solutions used to form conjugated polymer films leads to improved photoconductivity and improvements in other electronic properties. The enhanced conjugated polymer films can be used in a variety of electronic devices, such as solar cells and photodiodes.

10 Claims, 22 Drawing Sheets

(56) References Cited

U.S. PATENT DOCUMENTS

| | | | |
|---|---|---|---|
| 7,329,709 | B2 | 2/2008 | Gaudiana et al. |
| 7,745,724 | B2 | 6/2010 | Balasubramanian et al. |
| 8,227,691 | B2 | 7/2012 | Bazan et al. |
| 8,273,599 | B2 | 9/2012 | Bazan et al. |
| 8,318,532 | B2 | 11/2012 | Bazan et al. |
| 2002/0093005 | A1 | 7/2002 | Sohn et al. |
| 2003/0085397 | A1 | 5/2003 | Geens et al. |
| 2004/0007969 | A1 | 1/2004 | Lu et al. |
| 2004/0113903 | A1 | 6/2004 | Mikami et al. |
| 2004/0131934 | A1 | 7/2004 | Sugnaux et al. |
| 2004/0192830 | A1 | 9/2004 | Zhang |
| 2004/0214041 | A1 | 10/2004 | Lu et al. |
| 2005/0092359 | A1 | 5/2005 | Uchida et al. |
| 2005/0183764 | A1 | 8/2005 | Han et al. |
| 2005/0279399 | A1 | 12/2005 | Gaudiana et al. |
| 2006/0025311 | A1 | 2/2006 | Brabec et al. |
| 2006/0076050 | A1 | 4/2006 | Williams et al. |
| 2006/0107996 | A1 | 5/2006 | Shaheen et al. |
| 2006/0174937 | A1 | 8/2006 | Zhou |
| 2006/0211272 | A1* | 9/2006 | Lee et al. ............ 438/789 |
| 2006/0261314 | A1 | 11/2006 | Lang et al. |
| 2006/0292736 | A1* | 12/2006 | Lee et al. ............ 438/73 |
| 2007/0108539 | A1 | 5/2007 | Brabec et al. |
| 2007/0145324 | A1 | 6/2007 | Masuda |
| 2007/0181177 | A9 | 8/2007 | Sager et al. |
| 2007/0215864 | A1 | 9/2007 | Luebben et al. |
| 2007/0246094 | A1 | 10/2007 | Brabec et al. |
| 2009/0194167 | A1 | 8/2009 | Brabec et al. |
| 2010/0024860 | A1 | 2/2010 | He et al. |

FOREIGN PATENT DOCUMENTS

| | | | |
|---|---|---|---|
| EP | 1 816 491 | A1 | 8/2007 |
| WO | WO-01/86734 | A1 | 11/2001 |
| WO | WO-2004/063277 | A1 | 7/2004 |
| WO | WO-2004/105150 | A1 | 12/2004 |
| WO | WO-2006/123167 | A1 | 11/2006 |
| WO | WO-2007/076427 | A2 | 7/2007 |
| WO | WO-2007/076427 | A3 | 7/2007 |
| WO | WO-2008/066933 | A2 | 6/2008 |
| WO | WO-2008/066933 | A3 | 6/2008 |
| WO | WO-2009/058811 | A1 | 5/2009 |

OTHER PUBLICATIONS

Barber, R.P., Jr. et al. (2006, e-pub. Aug. 10, 2006). "Organic Photovoltaic Devices Based on a Block Copolymer/Fullerene Blend," *Organic Electronics* 7:508-513.

Chen, F.-C. et al. (Apr. 19, 2004). "Enhanced Efficiency of Plastic Photovoltaic Devices by Blending with Ionic Solid Electrolytes," *Applied Physics Letters* 84(16):3181-3183.

Chirvase, D. et al. (2003). "Electrical and Optical Design and Characterisation of Regioregular Poly(3-hexylthiophene-2,5diyl)(Fullerene-Based Heterojunction Polymer Solar Cells," *Synthetic Metals* 138:299-304.

Chirvase, D. et al. (2004). "Influence of Nanomorphology on the Photovoltaic Action of Polymer-Fullerene Composites," *Nanotechnology* 15:1317-1323.

Chirvase, D. et al. (Mar. 15, 2003). "Temperature Dependent Characteristics of Poly(3 Hexylthiophene)-Fullerene Based Heterojunction Organic Solar Cells," *Journal of Applied Physics* 93(6):3376-3383.

Coakley K.M. et al. (Oct. 20, 2003). "Photovoltaic Cells Made From Conjugated Polymers Infiltrated Into Mesoporous Titania," *Applied Physics Letters* 83(16):3380-3382.

Final Office Action mailed on Dec. 8, 2010, for U.S. Appl. No. 11/949,713, filed Dec. 3, 2007, eight pages.

Final Office Action mailed on Dec. 1, 2010, for U.S. Appl. No. 11/949,705, filed Dec. 3, 2007, eight pages.

Gao, J. et al. (1997). "Efficient Photodetectors and Photovoltaic Cells From Composites of Fullerenes and Conjugated Polymers: Photoinduced Electron Transfer," *presented at International Conference on Science and Technology of Synthetic Metals (ICSM '96)*, Snowbird, UT, USA, Jul. 28-Aug. 2, 1996, *Synthetic Materials* 84:979-980.

Gunes, S. et al. (Apr. 2007, e-pub. Apr. 11, 2007). "Conjugated Polymer-Based Organic Solar Cells," *Chem. Rev.* 107(4):1324-1338.

Hoppe, H. et al. (Oct. 2004, e-pub. Oct. 18, 2004). "Nanoscale Morphology of Conjugated Polymer/Fullerene-Based Bulk-Heterojunction Solar Cells," *Advanced Functional Materials* 14(10):1005-1011.

Hoppe, H. et al. (2006, e-pub. Nov. 28, 2005). "Morphology of Polymer/Fullerene Bulk Heterojunction Solar Cells," *Journal of Materials Chemistry* 16:45-61.

International Preliminary Report on Patentability mailed on Jun. 11, 2009, for PCT Application No. PCT/US2007/024792, filed on Dec. 3, 2007, eight pages.

International Search Report mailed on Mar. 4, 2009, for PCT Application No. PCT/US2008/081514, filed on Oct. 29, 2008, seven pages.

International Search Report mailed on May 7, 2008, for PCT Application No. PCT/US2007/024792, filed on Dec. 3, 2007, six pages.

Jenekhe, S.A. et al. (Oct. 23, 2000). "Efficient Photovoltaic Cells From Semiconducting Polymer Heterojunctions," *Applied Physics Letters* 77(17):2635-2637.

Lee, J.K. et al. (2008, e-pub. Feb. 21, 2008). "Processing Additives for Improved Efficiency from Bulk Heterojunction Solar Cells," *J. Am. Chem. Soc.* 130(11):3619-3623.

Li, G. et al. (Aug. 15, 2005). "Investigation of Annealing Effects and Film Thickness Dependence of Polymer Solar Cells Based on Poly(3-Hexylthiophene)," *J. Appl. Phys.* 98(4):043704-1-043704-5.

Ma, W. et al. (Oct. 2005). "Thermally Stable, Efficient Polymer Solar Cells with Nanoscale Control of the Interpenetrating Network Morphology," *Adv. Fund. Mater.* 15(10):1617-1622.

Martens, T. et al. (Jun. 2003). "Disclosure of the Nanostructure of MDMO-PPV: PCBM Bulk Hetero-Junction Organic Solar Cells by a Combination of SPM and TEM," *Synthetic Metals* 138(1-2):243-247.

Nguyen, T.-Q. et al. (2000, e-pub. Dec. 17, 1999). "Controlling Interchain Interactions in Conjugated Polymers: The Effects of Chain Morphology on Exciton—Exciton Annihilation and Aggregation in MEH-PPV Films," *J. Phys. Chem. B* 104:237-255.

Non-Final Office Action mailed on Apr. 27, 2010, for U.S. Appl. No. 11/949,705, filed Dec. 3, 2007, nine pages.

Non-Final Office Action mailed on May 26, 2010, for U.S. Appl. No. 11/949,713, filed Dec. 3, 2007, seven pages.

Peet, J. et al. (Dec. 2005). "Morphological Control of P3HT/PCBM Thin Films for Enhanced Polymer Solar Cell Performance," Poster, *presented at 2005 International Chemical Congress of Pacific Basin Societies*, Honolulu, Hawaii, Dec. 15-20, 2005, one page.

Peet, J. et al. (2006, e-pub. on Dec. 18, 2006). "Method for Increasing the Photoconductive Response in Conjugated Polymer/Fullerene Composites." *Appl. Phys. Lett.* 89:252105-1-252105-3.

Peet, J. et al. (Jul. 2007). "Efficiency Enhancement in Low-Bandgap Polymer Solar Cells by Processing with Alkane Dithiols," *Nature Materials* 6:497-500.

Rauch, T. et al. (Aug. 2004). "Performance of Bulk-Heterojunction Organic Photodetectors," *Proceedings of the 4th IEEE Conference on Nanotechnology*, Munich, Germany, Aug. 16-19, 2004, pp. 632-634.

Riedel, I. et al. (2004). "Polymer Solar Cells with Novel Fullerene-Based Acceptor," *Thin Solid Films* 451-452:43-47.

Written Opinion mailed on Mar. 4, 2009 for PCT Application No. PCT/US2008/081514, filed on Oct. 29, 2008, ten pages.

Written Opinion mailed on May 5, 2008, for PCT Application No. PCT/US2007/024792, filed on Dec. 3, 2007, six pages.

* cited by examiner

A.

B.

ENHANCING PERFORMING CHARACTERISTICS OF ORGANIC SEMICONDUCTING FILMS BY IMPROVED SOLUTION PROCESSING

CROSS REFERENCE TO RELATED APPLICATIONS

This application is a continuation of U.S. patent application Ser. No. 11/949,705, filed Dec. 3, 2007, which claims the priority benefit of U.S. Provisional Patent Application No. 60/872,221, filed Dec. 1, 2006, of U.S. Provisional Patent application No. 60/919,602, filed Mar. 23, 2007, and of U.S. Provisional Patent Application No. 60/938,433, filed May 16, 2007. The entire contents of those applications are hereby incorporated by reference herein.

STATEMENT REGARDING FEDERALLY SPONSORED RESEARCH OR DEVELOPMENT

This invention was made in part during the course of work under grant numbers DE-FG02-06ER46324 and DE-FG24-04NT42277 from the United States Department of Energy, grant number N-00014-04-0411 from the Office of Naval Research of the United States Navy, and under an NDSEG Fellowship from the United States Department of Defense. The United States Government has certain rights in this invention.

TECHNICAL FIELD

This application relates to polymer-based electronic devices and particularly to solution processing methods for enhancement of the characteristics of organic semiconducting films, such as used in organic photodetectors, solar cells, and thin film transistors.

BACKGROUND

Solar cells provide a renewable energy source that can be implemented in a wide variety of geographic regions. However, solar cells account for only a small percentage of energy production (for example, in the United States, solar energy accounted for 0.065% of energy production in 2005, a figure which includes both photovoltaic and solar thermal energy). The most common type of photovoltaic cell is made from silicon; however, preparing the high-purity silicon required for their manufacture is costly both in economic terms and the energy input required to purify the silicon. Thus silicon-based solar cells are used primarily in remote locations or in markets where the importance of ecological sustainability outweighs the cost of inorganic solar cells.

Organic thin-film-based solar cells, such as polymer-based solar cells, have been the subject of much research as alternatives to the high-cost inorganic solar cells. These solar cells are typically fabricated with an electron donor material and an electron acceptor material, which allows an electron-hole pair (an exciton) generated by a photon to separate and generate current. The junction between the donor and acceptor can be created by forming a layer of one material (e.g., the donor) on top of the other material (e.g., the acceptor), which forms a planar heterojunction between the bilayers. Since the planar bilayer heterojunction affords a relatively small area for charge separation to occur, different morphologies have been explored. Interpenetrating networks of donor and acceptor materials can be used; these range from diffuse interfaces at a bilayer heterojunction to bulk heterojunctions, where the donor and acceptor materials are mixed together and form a multi-component active layer.

Bulk heterojunction (BHJ) solar cells can be fabricated from blends containing a conjugated polymer and a fullerene derivative and have the potential to generate inexpensive, flexible, photoconductive devices such as photodetectors and solar cells, avoiding the cost constraints of silicon-based devices. A major advantage of such plastic solar cells rests in their ability to be processed from solution, a feature which may make polymer-based devices more economically viable than small-molecule based organic photovoltaic cells.

DISCLOSURE OF THE INVENTION

The invention relates to methods for modifying organic semiconductor films, such as conjugated polymer films, in order to provide improved performance characteristics of the films, where the characteristics are photoconductivity, charge transport, solar conversion efficiency, and/or photovoltaic efficiency. In one embodiment, the invention embraces modifying the internal structure or morphology of organic semiconductor films in order to provide improved performance characteristics. In one embodiment, the conjugated polymer films are bulk heterojunction (BHJ) films, and the invention relates to methods for improved or increased photoconductivity, charge transport, solar conversion efficiency, and/or photovoltaic efficiency of the BHJ films, or devices fabricated from BHJ films. In another embodiment, the invention embraces films having improved or increased photoconductivity, charge transport, solar conversion efficiency, and/or photovoltaic efficiency. The invention also relates to electronic devices incorporating organic semiconductor films, conjugated polymer films, and/or bulk heterojunction films processed according to the methods disclosed herein.

In another embodiment, the invention embraces methods of modifying organic semiconductor films, conjugated polymer films, and/or bulk heterojunction films by adding a processing additive to a solution used to form the film, prior to the formation of the film.

In one embodiment, the invention embraces a method of increasing the photoconductivity, charge transport, solar energy conversion efficiency, or photovoltaic efficiency of an organic semiconductor film, comprising the steps of adding an amount of one or more low molecular weight alkyl-containing molecules to a solution of one or more organic semiconductors, and forming the organic semiconductor film from the solution.

In one embodiment, the one or more low molecular weight alkyl-containing molecules are selected from alkanes, alcohols, and alkyl thiols. In another embodiment, the low molecular weight alkyl-containing molecules are selected from $C_1$-$C_{20}$ alkanes. In another embodiment, the low molecular weight alkyl-containing molecules are selected from $C_1$-$C_{20}$ alcohols. In another embodiment, the low molecular weight alkyl-containing molecules are selected from $C_1$-$C_{20}$ alkanethiols.

In one embodiment, the one or more low molecular weight alkyl-containing molecules is present in the solution used to form the conjugated polymer film in an amount of about 0.1% to about 10% v/v.

The organic semiconductor film can comprise a conjugated polymer film. The conjugated polymer film can serve as an electron donor; alternatively, the conjugated polymer film can serve as an electron acceptor. When the conjugated polymer film serves as an electron donor, the organic semiconductor film can additionally comprise an organic electron acceptor;

when the conjugated polymer film serves as an electron acceptor, the organic semiconductor film can additionally comprise an organic electron donor. The organic electron donor and/or the organic electron acceptor can be a second conjugated polymer film.

In one embodiment, the conjugated polymer film electron donor comprises a polymer selected from polyacetylene, a polyphenylene, poly(3-alkylthiophenes) where alkyl is from 6 to 16 carbons (P3AT's), poly-(3-hexylthiophene) (P3HT), poly[2,6-(4,4-bis-(2-ethylhexyl)-4H-cyclopenta[2,1-b;3,4-b]-dithiophene)-alt-4,7-(2,1,3-benzothiadiazole)] (PCP-DTBT), polyphenylacetylene, polydiphenylacetylene, polyanilines, poly(p-phenylene vinylene) (PPV) and alkoxy derivatives thereof, poly(2-methoxy,5-(2'-ethyl-hexyloxy)-p-phenylenevinylene) (MEH-PPV), poly(2,5-dimethoxy-p-phenylene vinylene) (PDMPV), a polythiophene, a poly(thienylenevinylene), poly(2,5-thienylenevinylene), a polyporphyrin, a porphyrinic macrocycle, a thiol-derivatized polyporphyrin, a polymetallocene, a polyferrocene, a polyphthalocyanine, a polyvinylene, a polyphenylvinylene, a polysilane, a polyisothianaphthalene, or a polythienylvinylene. In another embodiment, the conjugated polymer film electron donor can comprise a derivative of one or more of the foregoing materials. In another embodiment, the conjugated polymer film electron donor can comprise a blend or combination of two or more of the foregoing materials in any proportion.

The organic electron acceptor can be a fullerene derivative, such as a fullerene derivative selected from compounds of the formula:

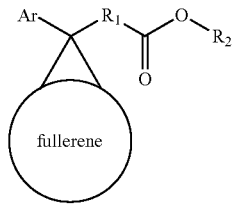

where the circle indicated as "fullerene" is independently selected from a $C_{60}$, $C_{70}$, or $C_{84}$ fullerene moiety; Ar is independently phenyl or thienyl, which can be optionally substituted; $R_1$ is independently $C_1$-$C_{12}$ alkyl; and $R_2$ is independently —O—$C_1$-$C_{12}$ alkyl or —O—$C_1$-$C_{12}$ alkyl-SH. In one embodiment, the fullerene derivative is C61-PCBM. In another embodiment, the fullerene derivative is C71-PCBM.

In one embodiment where the organic semiconductor film comprises a conjugated polymer electron donor/fullerene derivative electron acceptor, the ratio of polymer to fullerene derivative can range from about 5:1 to 1:10, about 2:1 to 1:5, preferably about 1:1 to 1:5, more preferably about 1:2 to 1:4 or about 1:2 to 1:3. In other embodiments, the polymer concentration can be about 0.01% to 10% by weight of the solution, about 0.1% to 10% by weight of the solution, about 0.1% to 5% by weight of the solution, about 0.5% to 5% by weight of the solution, about 0.5% to 3% by weight of the solution, about 0.5% to 3% by weight of the solution, about 0.5% to 2% by weight of the solution, about 0.5% to 1% by weight of the solution, or about 0.8% to 1% by weight of the solution.

The organic semiconductor film can be fabricated in any form that provides for separation of electron-hole pairs. In one embodiment, the organic semiconductor film is fabricated from a conjugated polymer film electron donor and an organic electron acceptor in a planar bilayer form. In another embodiment, the organic semiconductor film is fabricated from a conjugated polymer film electron donor and an organic electron acceptor in a bilayer form with a diffuse interface. In another embodiment, the organic semiconductor film is fabricated from a conjugated polymer film electron donor and an organic electron acceptor in a bulk heterojunction form.

The organic semiconductor film in any of its forms, or the conjugated polymer film, can be formed by spin casting, doctor blading, drop-casting, sequential spin-casting, formation of Langmuir-Blodgett films, electrostatic adsorption techniques, and/or dipping the substrate into the solution. Subsequent processing steps can include evaporation of the solvent to form the film, optionally under reduced pressure and/or elevated temperature; and thermal annealing of the deposited film. In one embodiment, when the film is formed by spin casting, the spin speed can range from about 500 to 2000 RPM, or about 1200 RPM to 1600 RPM.

The solvent used to form the organic semiconductor film can be selected from chlorobenzene, dichlorobenzene, trichlorobenzene, benzene, toluene, chloroform, dichloromethane, dichloroethane, xylenes, α,α,α-trichlorotoluene, methyl naphthalene, chloronaphthalene, or mixtures thereof. Dichlorobenzene can include o-dichlorobenzene, m-dichlorobenzene, p-dichlorobenzene, or mixtures thereof in any proportion. Methyl naphthalene can include 1-methylnaphthalene, 2-methylnaphthalene, or mixtures thereof in any proportion. Chloronaphthalene can include 1-chloronaphthalene, 2-chloronaphthalene, or mixtures thereof in any proportion.

In one embodiment, the invention embraces organic semiconductor films fabricated according to the methods of the invention. In another embodiment, the invention embraces electronic devices formed from organic semiconductor films fabricated according to the methods of the invention; these devices include, but are not limited to, solar cells, photovoltaic cells, photodetectors, photodiodes, or phototransistors. Electronic devices according to the invention can comprise a first electrode, an organic semiconductor film having a first side and a second side, where the first side of the organic semiconductor film contacts the first electrode and where the film is formed by adding an amount of one or more low molecular weight alkyl-containing molecules to a solution used to form the organic semiconductor film, and a second electrode contacting the second side of the organic semiconductor film. The organic semiconductor film of the devices can comprise a conjugated polymer film. The first electrode and the second electrode can have different work functions. In one embodiment, the first electrode can be a high work function material. The second electrode can be a low work function material.

In another embodiment, the invention embraces a method of increasing the photoconductivity, charge transport, solar energy conversion efficiency, or photovoltaic efficiency of an organic semiconductor film, comprising the steps of adding an amount of one or more low molecular weight alkyl-containing molecules to a solution of one or more organic semiconductors, and forming the organic semiconductor film from the solution, wherein the low molecular weight alkyl-containing molecules are selected from the group consisting of $C_1$-$C_{20}$ alkanes substituted with one or more substituents selected from aldehyde, dioxo, hydroxy, alkoxy, thiol, thioalkyl, carboxylic acid, ester, amine, amide, ether, thioether, halide, fluoride, chloride, bromide, iodide, nitrile, epoxide, aromatic, and arylalkyl groups, with the proviso that if a thiol or hydroxy group substituent is present, at least one independently chosen additional substituent must also be present, and with the proviso that di-halo substituted compounds are excluded from the low molecular weight alkyl-containing molecules. In another embodiment, poly-halo substituted compounds are excluded from the low molecular weight alkyl-containing molecules. In another embodiment, mono-halo substituted compounds are excluded from the low molecular weight alkyl-containing molecules.

In one embodiment, the low molecular weight alkyl-containing molecules are selected from $C_1$-$C_{20}$ alkanes substituted with at least one hydroxy group and at least one thiol group. In another embodiment, the one or more low molecular weight alkyl-containing molecules are selected from $C_1$-$C_{20}$ dithioalkanes; the $C_1$-$C_{20}$ dithioalkanes can be alpha, omega-substituted. In another embodiment, the low molecular weight alkyl-containing molecules are selected from $C_1$-$C_{20}$ iodoalkanes.

In one embodiment, the one or more low molecular weight alkyl-containing molecules is present in the solution used to form the conjugated polymer film in an amount of about 0.1% to about 10% v/v.

The organic semiconductor film can comprise a conjugated polymer film. The conjugated polymer film can serve as an electron donor; alternatively, the conjugated polymer film can serve as an electron acceptor. When the conjugated polymer film serves as an electron donor, the organic semiconductor film can additionally comprise an organic electron acceptor; when the conjugated polymer film serves as an electron acceptor, the organic semiconductor film can additionally comprise an organic electron donor. The organic electron donor and/or the organic electron acceptor can be a second conjugated polymer film.

In one embodiment, the conjugated polymer film electron donor comprises a polymer selected from polyacetylene, a polyphenylene, poly(3-alkylthiophenes) where alkyl is from 6 to 16 carbons (P3AT's), poly-(3-hexylthiophene) (P3HT), poly[2,6-(4,4-bis-(2-ethylhexyl)-4H-cyclopenta[2,1-b;3,4-b']-dithiophene)-alt-4,7-(2,1,3-benzothiadiazole)] (PCP-DTBT), polyphenylacetylene, polydiphenylacetylene, polyanilines, poly(p-phenylene vinylene) (PPV) and alkoxy derivatives thereof, poly(2-methoxy,5-(2'-ethyl-hexyloxy)-p-phenylenevinylene) (MEH-PPV), poly(2,5-dimethoxy-p-phenylene vinylene) (PDMPV), a polythiophene, a poly(thienylenevinylene), poly(2,5-thienylenevinylene), a polyporphyrin, a porphyrinic macrocycle, a thiol-derivatized polyporphyrin, a polymetallocene, a polyferrocene, a polyphthalocyanine, a polyvinylene, a polyphenylvinylene, a polysilane, a polyisothianaphthalene, or a polythienylvinylene. In another embodiment, the conjugated polymer film electron donor can comprise a derivative of one or more of the foregoing materials. In another embodiment, the conjugated polymer film electron donor can comprise a blend or combination of two or more of the foregoing materials in any proportion.

The organic electron acceptor can be a fullerene derivative, such as a fullerene derivative selected from compounds of the formula:

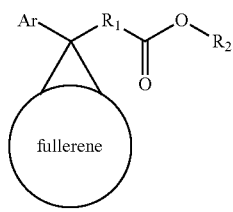

where the circle indicated as "fullerene" is independently selected from a $C_{60}$, $C_{70}$, or $C_{84}$ fullerene moiety; Ar is independently phenyl or thienyl, which can be optionally substituted; $R_1$ is independently $C_1$-$C_{12}$ alkyl; and $R_2$ is independently —O—$C_1$-$C_{12}$ alkyl or —O—$C_1$-$C_{12}$ alkyl-SH. In one embodiment, the fullerene derivative is C61-PCBM. In another embodiment, the fullerene derivative is C71-PCBM.

In one embodiment where the organic semiconductor film comprises a conjugated polymer electron donor/fullerene derivative electron acceptor, the ratio of polymer to fullerene derivative can range from about 5:1 to 1:10, about 2:1 to 1:5, preferably about 1:1 to 1:5, more preferably about 1:2 to 1:4 or about 1:2 to 1:3. In other embodiments, the polymer concentration can be about 0.01% to 10% by weight of the solution, about 0.1% to 10% by weight of the solution, about 0.1% to 5% by weight of the solution, about 0.5% to 5% by weight of the solution, about 0.5% to 3% by weight of the solution, about 0.5% to 3% by weight of the solution, about 0.5% to 2% by weight of the solution, about 0.5% to 1% by weight of the solution, or about 0.8% to 1% by weight of the solution.

The organic semiconductor film can be fabricated in any form that provides for separation of electron-hole pairs. In one embodiment, the organic semiconductor film is fabricated from a conjugated polymer film electron donor and an organic electron acceptor in a planar bilayer form. In another embodiment, the organic semiconductor film is fabricated from a conjugated polymer film electron donor and an organic electron acceptor in a bilayer form with a diffuse interface. In another embodiment, the organic semiconductor film is fabricated from a conjugated polymer film electron donor and an organic electron acceptor in a bulk heterojunction form.

The organic semiconductor film in any of its forms, or the conjugated polymer film, can be formed by spin casting, doctor blading, drop-casting, sequential spin-casting, formation of Langmuir-Blodgett films, electrostatic adsorption techniques, and/or dipping the substrate into the solution. Subsequent processing steps can include evaporation of the solvent to form the film, optionally under reduced pressure and/or elevated temperature; and thermal annealing of the deposited film. In one embodiment, when the film is formed by spin casting, the spin speed can range from about 500 to 2000 RPM, or about 1200 RPM to 1600 RPM.

The solvent used to form the organic semiconductor film can be selected from chlorobenzene, dichlorobenzene, trichlorobenzene, benzene, toluene, chloroform, dichloromethane, dichloroethane, xylenes, α,α,α-trichlorotoluene, methyl naphthalene, chloronaphthalene, or mixtures thereof. Dichlorobenzene can include o-dichlorobenzene, m-dichlorobenzene, p-dichlorobenzene, or mixtures thereof in any proportion. Methyl naphthalene can include 1-methylnaphthalene, 2-methylnaphthalene, or mixtures thereof in any proportion. Chloronaphthalene can include 1-chloronaphthalene, 2-chloronaphthalene, or mixtures thereof in any proportion.

In one embodiment, the invention embraces organic semiconductor films fabricated according to the methods of the invention. In another embodiment, the invention embraces electronic devices formed from organic semiconductor films fabricated according to the methods of the invention; these devices include, but are not limited to, solar cells, photovoltaic cells, photodetectors, photodiodes, or phototransistors. Electronic devices according to the invention can comprise a first electrode, an organic semiconductor film having a first side and a second side, where the first side of the organic semiconductor film contacts the first electrode and where the film is formed by adding an amount of one or more low molecular weight alkyl-containing molecules to a solution used to form the organic semiconductor film, and a second electrode contacting the second side of the organic semiconductor film, wherein the low molecular weight alkyl-containing molecules are selected from the group consisting of $C_1$-$C_{20}$ alkanes substituted with one or more substituents selected from aldehyde, dioxo, hydroxy, alkoxy, thiol, thioalkyl, carboxylic acid, ester, amine, amide, ether, thioether, halide, fluoride, chloride, bromide, iodide, nitrile, epoxide, aromatic, and arylalkyl groups, with the proviso that if a thiol or hydroxy group substituent is present, at least one independently chosen additional substituent must also be present. The organic semiconductor film of the devices can comprise a conjugated polymer film. The first electrode and the second electrode can have different work functions. In one embodiment, the first electrode can be a high work function material. The second electrode can be a low work function material.

In one embodiment of the invention, di-halo substituted compounds are excluded from the low molecular weight alkyl-containing molecules. In another embodiment, polyhalo substituted compounds are excluded from the low molecular weight alkyl-containing molecules. In another embodiment, mono-halo substituted compounds are excluded from the low molecular weight alkyl-containing molecules. In another embodiment, any halo-substituted compound is excluded from the low molecular weight alkyl-containing compounds.

BRIEF DESCRIPTION OF THE DRAWINGS

(FIG. 2b) alkyl thiol chain length; and (FIG. 2c) n-octanethiol concentration. Samples are on alumina substrates and consist of: BHJ-NA indicated by x's (X), BHJ-A indicated by asterisks * ( )✳, BHJ-5% C8-A indicated by open circles (○), BHJ-5% C8-NA indicated by filled circles (●), BHJ-5% C12-A indicated by filled squares (■), BHJ-5% C6-A by open squares (□), BHJ-0.1% C8-A by open inverted triangles (∇), BHJ-0.75% C8-NA by filled diamonds (◆), BHJ-0.75% C8-A by open diamonds (◇), BHJ-1% C8-A by open triangles (Δ), and BHJ-10% C8-A by filled triangles (▲).

MODES FOR CARRYING OUT THE INVENTION

Figure 1:
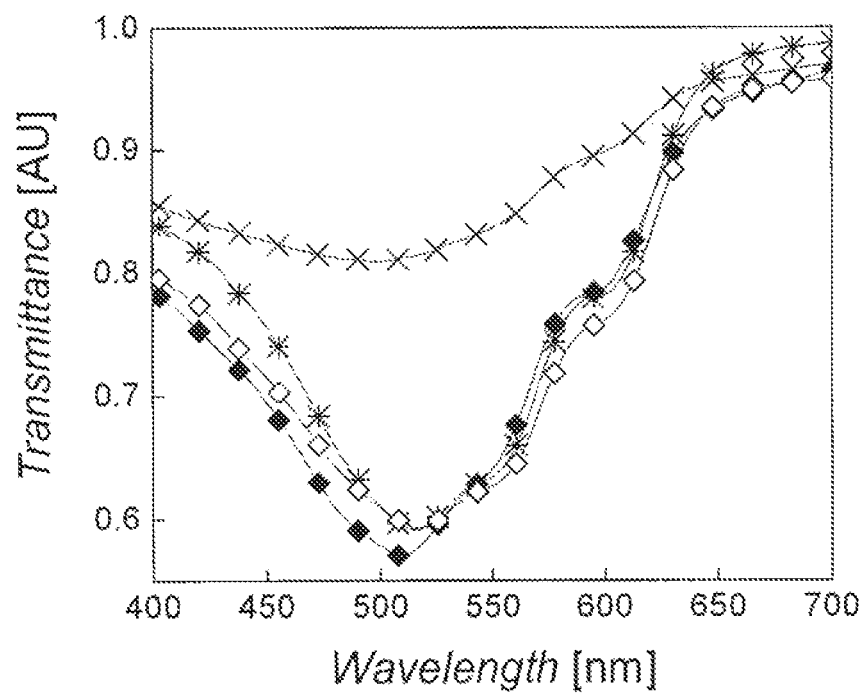
FIG. 1 depicts transmittance through films, for films on glass substrates: BHJ-NA (x's, X), BHJ-A (asterisks or *, ✳), BHJ-1% C8-NA (filled diamonds, ◆), and BHJ-1% C8-A (open diamonds, ◇).

Various embodiments of the present invention are described hereinafter. It should be noted that an aspect described in conjunction with a particular embodiment of the present invention is not necessarily limited to that embodiment and can be practiced in any other embodiments of the present invention. For instance, in the following description, some embodiments of the present invention are described with embodiments of polymer blends such as P3HT/$C_{61}$-PCBM, and PCPDTBT-$C_{71}$-PCBM. It will be appreciated that the claimed invention may also be used with other polymers blends.

High charge separation efficiency combined with the reduced fabrication costs associated with solution processing and the potential for implementation on flexible substrates highlight the promising potential of "plastic" solar cells. Attempts to control the donor/acceptor morphology in bulk heterojunction materials as required for achieving high power conversion efficiency have, however, met with limited success. By incorporating additives such as alkanedithiols in the solution used to spin cast films comprising a low bandgap polymer and a fullerene derivative, the power conversion efficiency of photovoltaic cells (AM 1.5 G conditions) is increased; e.g., with an alkanedithiol, power conversion efficiency is increased from 2.8% to 5.5% through altering the bulk heterojunction morphology.

Some embodiments of the invention embrace improved bulk heterojunction "plastic" solar cells, which are based on phase—separated blends of polymer semiconductors and fullerene derivatives. Because of self-assembly on the nanometer length-scale, mobile carriers and excitons formed after absorption of solar irradiation diffuse to a heterojunction prior to recombination and are dissociated at the polymer/fullerene interface. Ultrafast charge transfer from semiconducting polymers to fullerenes ensures that the quantum efficiency for charge transfer (CT) at the interface approaches unity, with electrons on the fullerene network and holes on the polymer network. After breaking the symmetry by using different metals for the two electrodes, electrons migrate toward the lower work function metal and holes migrate toward the higher work function metal. Despite high charge separation efficiency, a significant fraction of carriers recombine at donor/acceptor interfaces prior to extraction from the device due, in part, to the inherently random interpenetrating network morphology formed after spin casting. Carrier recombination prior to reaching the electrodes and low mobility limit both the device fill factor (FF) and the overall photon harvesting by reducing the optimum active layer thickness. The carrier lifetime is largely controlled by the phase morphology between the donor and acceptor materials. Although significant advancements in the performance of polymer-based photovoltaic devices have been made during the past few years, the ability to control the morphology of the donor/acceptor network is critical to optimizing efficiency.

It has been discovered that adding certain compounds to the solutions from which the organic semiconductor films, such as bulk heterojunction films, are cast can modify the phase separation and phase morphology of the films. This approach offers the potential to introduce morphology control to bulk heterojunction materials during device fabrication without need for subsequent thermal annealing.

The most efficient bulk heterojunction devices to date have utilized the high mobility semiconducting polymer, P3HT, as the photo-donor, and the soluble fullerene derivative, [6,6]-phenyl $C_{61}$-butyric acid methyl ester ($C_{61}$-PCBM), as the acceptor. Despite considerable effort, however, power conversion efficiencies obtained from P3HT:$C_{61}$-PCBM solar cells are limited to values of approximately 5% due principally to the poor overlap between the P3HT absorption spectrum and the solar emission spectrum. With improved light harvesting in the near infra-red (NIR) by a low bandgap polymer, such as poly[2,6-(4,4-bis-(2-ethylhexyl)-4H-cyclopenta[2,1-b;3,4-b']-dithiophene)-alt-4,7-(2,1,3-benzothiadiazole)] (PCPDTBT), higher power conversion efficiencies should be attainable. The energy gap of PCPDTBT is nearly ideal for solar photovoltaic applications, $E_g$=1.46 eV. The molecular structure of PCPDTBT is

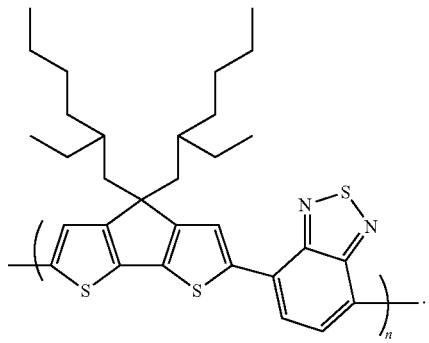

An asymmetric $C_{70}$ fullerene was chosen for some embodiments because of its increased absorption in the visible, which leads to better overlap with the solar spectrum relative to that obtained with the $C_{61}$ analogue. Thermal annealing or controlled solvent evaporation after film casting have proven desirable for optimizing charge separation and transport within the bulk heterojunction morphology; unfortunately, attempts to improve the performance of PCPDTBT:$C_{71}$-PCBM solar cells through similar methods have not been successful. The present invention provides straightforward and cost-effective methods of improving performance of such cells.

Alkyl-Containing Molecules

A variety of alkyl-containing molecules can be used in the instant invention. An "alkyl-containing molecule" is defined as a molecule that contains at least one $sp^3$-hybridized carbon, where the at least one $sp^3$-hybridized carbon is bonded to at least two hydrogen atoms. Thus, molecules containing —$CH_2$— or —$CH_3$ fall within the definition of alkyl-containing molecules, as does methane ($CH_4$). A low molecular weight alkyl-containing molecule is an alkyl-containing molecule of molecular weight equal to or less than about 1000 daltons. The alkyl-containing molecule must also be able to be included in the solution used to form or deposit the polymer film. If the alkyl-containing molecule is a liquid, it can be mixed into the solution; if it is a gas, it can be bubbled or otherwise dispersed into the solution; if it is a solid, it can be dissolved or melted into the solution or included as a suspension. Finally, the alkyl-containing molecules should be sufficiently stable to be suitable for the deposition process and unreactive with the materials in the organic semiconductor layer and other components of devices which they may contact.

Alkyl-containing molecules can be substituted with a functional group selected from aldehyde (—C(=O)—H), dioxo (i.e., an $sp^2$-hybridized oxygen molecule occupying two valences on a carbon atom to form a ketone, —C(=O)—), hydroxy (—OH), alkoxy (—O—$C_1$-$C_{12}$ alkyl), thiol (—SH), thioalkyl (—S—$C_1$-$C_{12}$ alkyl), carboxylic acid (—COOH), ester (—C(=O)—O—$C_1$-$C_{12}$ alkyl), amine (—$NH_2$, —NH($C_1$-$C_{12}$ alkyl), or —N($C_1$-$C_{12}$ alkyl)$_2$), amide (—C(=O)—$NH_2$, —C(=O)—NH($C_1$-$C_{12}$ alkyl), or —C(=O)—N($C_1$-$C_{12}$ alkyl)$_2$), ether (—O—), thioether (sulfide) (—S—), halide (such as fluoride, chloride, bromide, and iodide)), nitrile (—CN), epoxide, aromatic groups such as $C_6$-$C_{10}$ aryl, and arylalkyl groups. Aromatic groups include, but are not limited to, $C_6$-$C_{10}$ aryl groups, such as phenyl, benzyl, and naphthyl groups. Arylalkyl (or aralkyl) groups include, but are not limited to, $C_0$-$C_6$alkyl-$C_6$-$C_{10}$ aryl-$C_0$-$C_6$ alkyl groups.

Examples of aldehydes include, but are not limited to, $C_1$-$C_{12}$ alkyl-C(=O)—H; examples of ketones include, but are not limited to, $C_1$-$C_{12}$ ketones, examples of hydroxy—substituted compounds (alcohols) include, but are not limited to, $C_1$-$C_{12}$ alkyl-OH; examples of alkoxy compounds include, but are not limited to, $C_1$-$C_{12}$ alkyl substituted with —O—$C_1$-$C_{12}$ alkyl; examples of thiol compounds include, but are not limited to, $C_1$-$C_{12}$ alkyl-SH; examples of thioalkyl compounds include, but are not limited to, $C_1$-$C_{12}$ alkyl substitued with —S—$C_1$-$C_{12}$ alkyl; examples of carboxylic acid compounds include, but are not limited to, $C_1$-$C_{12}$ alkyl-COOH; examples of ester compounds include, but are not limited to, $C_1$-$C_{12}$ alkyl-C(=O)—O—$C_1$-$C_{12}$ alkyl; examples of amine compounds include, but are not limited to, $C_1$-$C_{12}$ alkyl-$NH_2$, $C_1$-$C_{12}$ alkyl-NH($C_1$-$C_{12}$ alkyl), or $C_1$-$C_{12}$ alkyl-N($C_1$-$C_{12}$ alkyl)$_2$; examples of amide compounds include, but are not limited to, $C_1$-$C_{12}$ alkyl-C(=O)—$NH_2$, $C_1$-$C_{12}$ alkyl-C(=O)—NH($C_1$-$C_{12}$ alkyl), or $C_1$-$C_{12}$ alkyl-C(=O)—N($C_1$-$C_{12}$ alkyl)$_2$); examples of ether compounds include, but are not limited to, $C_1$-$C_{12}$ alkyl-O—

$C_1$-$C_{12}$ alkyl; examples of thioether compounds include, but are not limited to, but are not limited to, $C_1$-$C_{12}$ alkyl-S—$C_1$-$C_{12}$ alkyl; examples of halide compounds include, but are not limited to, $C_1$-$C_{12}$ alkyl-X (where X is F, Cl, Br, or I); examples of nitrile compounds include, but are not limited to, $C_1$-$C_{12}$ alkyl-CN; examples of epoxide compounds include, but are not limited to, $C_1$-$C_{12}$ alkyl where two adjacent carbon atoms are bridged by an oxygen atom to form a three-membered epoxide ring, and also include, but are not limited to, $C_1$-$C_{12}$ alkyl-($C_2H_3O$); examples of aromatic-substituted alkyl compounds include, but are not limited to, $C_1$-$C_{12}$ alkyl-$C_6$-$C_{10}$ aryl; examples of arylalkyl-substituted alkyl compounds include, but are not limited to, $C_1$-$C_{12}$ alkyl-$C_6$-$C_{10}$ aryl-$C_0$-$C_{12}$ alkyl. All groups on all compounds can be chosen independently, e.g., for the amide compound $C_1$-$C_{12}$ alkyl-C(=O)—N($C_1$-$C_{12}$ alkyl)$_2$, the three $C_1$-$C_{12}$ alkyl groups can be independently chosen, such as the compound $CH_3CH_2CH_2CH_2$—(C=O)—N($CH_3$)($CH_2CH_3$). The substituent can be attached to any carbon of the alkyl it substitutes; for example, $C_3$ alkyl-OH can indicate 1-propanol (HO—$CH_2CH_2CH_3$) or 2-propanol ($CH_3CH$(OH)$CH_3$).

In one embodiment, the alkyl-containing molecules are selected from alkanes, alcohols, and thiols.

Alkanes include, but are not limited to, $C_1$-$C_{20}$ alkanes, such as methane, ethane, propane, butane, pentane, hexane, heptane, octane, nonane, decane, undecane, dodecane, tridecane, tetradecane, pentadecane, hexadecane, octadecane, nonadecane, and eicosane (icosane). Alkyls can be straight-chain (n-alkyl), branched-chain, or cyclic; cyclic alkanes can be substituted with n-alkyl and/or branched alkyl groups. In another embodiment, the alkanes are selected from $C_6$-$C_{12}$ alkanes, such as hexane, heptane, octane, nonane, decane, undecane, and dodecane. In other embodiments, the alkanes are selected from $C_4$-$C_{20}$ alkanes, $C_4$-$C_{16}$ alkanes, $C_5$-$C_{20}$ alkanes, or $C_5$-$C_{16}$ alkanes. In other embodiments, the alkanes are selected from $C_1$-$C_{20}$ n-alkanes (methane, ethane, propane, n-butane, n-pentane, n-hexane, n-heptane, n-octane, n-nonane, n-decane, n-undecane, n-dodecane, n-tridecane, n-tetradecane, n-pentadecane, n-hexadecane, n-octadecane, n-nonadecane, and n-eicosane), $C_4$-$C_{20}$ n-alkanes, $C_4$-$C_{16}$ n-alkanes, $C_5$-$C_{20}$ n-alkanes, $C_5$-$C_{16}$ n-alkanes, or $C_6$-$C_{12}$ n-alkanes.

Alcohols are alkanes where one hydroxy (—OH) group is substituted in place of one hydrogen of the alkane. Alcohols include, but are not limited to, $C_1$-$C_{20}$ alcohols such as methanol, ethanol, propanol, butanol, pentanol, hexanol, heptanol, octanol, nonanol, decanol, undecanol, dodecanol, tridecanol, tetradecanol, pentadecanol, hexadecanol, heptadecanol, octadecanol, nonadecanol, and eicosanol, where the hydroxy group can be located at any carbon atom bonded to three or fewer other carbon atoms. Alcohols can be straight-chain (e.g., n-decanol), branched-chain (e.g., t-butanol), or cyclic (e.g., cyclohexanol); cyclic alcohols can be substituted with n-alkyl and/or branched alkyl groups, and cyclic alkanes can be substituted with one straight-chain alcohol or one branched alcohol, plus additional n-alkyl and/or branched alkyl groups. In another embodiment, the alkanols are selected from $C_4$-$C_{16}$ alkanols or $C_6$-$C_{12}$ alkanols. In other embodiments, the alkanols are selected from $C_1$-$C_{20}$ n-alkanols (methanol, ethanol, propanol, n-butanol, n-pentanol, n-hexanol, n-heptanol, n-octanol, n-nonanol, n-decanol, n-undecanol, n-dodecanol, n-tridecanol, n-tetradecanol, n-pentadecanol, n-hexadecanol, n-heptadecanol, n-octadecanol, n-nonadecanol, and n-eicosanol), $C_4$-$C_{16}$ n-alkanols, or $C_6$-$C_{12}$ n-alkanols. In another embodiment, the foregoing groups of alcohols are 1-ols, that is, the alcohol group is present on the 1-carbon or alpha-carbon of the molecule (methanol, ethanol, 1-propanol, 1-butanol, 1-pentanol, 1-hexanol, 1-heptanol, 1-octanol, 1-nonanol, 1-decanol, 1-undecanol, 1-dodecanol, 1-tridecanol, 1-tetradecanol, 1-pentadecanol, 1-hexadecanol, 1-heptadecanol, 1-octadecanol, 1-nonadecanol, and 1-eicosanol). In another embodiment, the alkanols are selected from $C_1$-$C_{20}$ n-alkan-1-ols.

In another embodiment, the alkyl-containing molecules are selected from alkanethiols. Alkanethiols (or alkylthiols) are alkanes where one thiol (sulfhydryl) group (—SH) is substituted in place of one hydrogen of the alkane. Alkanethiols include, but are not limited to, $C_1$-$C_{20}$ alkanethiols such as methanethiol, ethanethiol, propanethiol, butanethiol, pentanethiol, hexanethiol, heptanethiol, octanethiol, nonanethiol, decanethiol, undecanethiol, dodecanethiol, tridecanethiol, tetradecanethiol, pentadecanethiol, hexadecanethiol, heptadecanethiol, octadecanethiol, nonadecanethiol, and eicosanethiol, where the thiol group can be located at any carbon atom bonded to three or fewer other carbon atoms. Alkanethiols can be straight-chain (e.g., n-decanethiol), branched-chain (e.g., t-butanethiol), or cyclic (e.g., cyclohexanethiol); cyclic alkanethiols can be substituted with n-alkyl and/or branched alkyl groups, and cyclic alkanes can be substituted with one straight-chain alkanethiol or one branched alkanethiol, plus additional n-alkyl and/or branched alkyl groups. In another embodiment, the alkanethiols are selected from $C_4$-$C_{16}$ alkanethiols or $C_6$-$C_{12}$ alkanethiols. In other embodiments, the alkanethiols are selected from $C_1$-$C_{20}$ n-alkanethiols (methanethiol, ethanethiol, propanethiol, n-butanethiol, n-pentanethiol, n-hexanethiol, n-heptanethiol, n-octanethiol, n-nonanethiol, n-decanethiol, n-undecanethiol, n-dodecanethiol, n-tridecanethiol, n-tetradecanethiol, n-pentadecanethiol, n-hexadecanethiol, n-heptadecanethiol, n-octadecanethiol, n-nonadecanethiol, and n-eicosanethiol), $C_4$-$C_{16}$ n-alkanethiols, or $C_6$-$C_{12}$ n-alkanethiols.

In another embodiment, the foregoing groups of alkanethiols are 1-thiols, that is, the thiol group is present on the 1-carbon or alpha-carbon of the molecule (methanethiol, ethanethiol, 1-propanethiol, 1-butanethiol, 1-pentanethiol, 1-hexanethiol, 1-heptanethiol, 1-octanethiol, 1-nonanethiol, 1-decanethiol, 1-undecanethiol, 1-dodecanethiol, 1-tridecanethiol, 1-tetradecanethiol, 1-pentadecanethiol, 1-hexadecanethiol, 1-heptadecanethiol, 1-octadecanethiol, 1-nonadecanethiol, and 1-eicosanethiol). In another embodiment, the alkanethiols are selected from $C_1$-$C_{20}$ n-alkane-1-thiols.

In another embodiment, the alkyl-containing molecules are selected from alkyl halides. Alkyl halides are alkanes where one halide group (—F, —Cl, —Br, —I) is substituted in place of one hydrogen of the alkane. Alkyl halides include, but are not limited to, $C_1$-$C_{20}$ alkyl halides such as halomethane, haloethane, halopropane, halobutane, halopentane, halohexane, haloheptane, halooctane, halononane, halodecane, haloundecane, halododecane, halotridecane, halotetradecane, halopentadecane, halohexadecane, haloheptadecane, halooctadecane, halononadecane, and haloeicosane, where the halide group can be located at any carbon atom bonded to three or fewer other carbon atoms. Alkyl halides can be straight-chain (e.g., n-decyl halide), branched-chain (e.g., t-butyl halide), or cyclic (e.g., cyclohexyl halide); cyclic alkyl halides can be substituted with n-alkyl and/or branched alkyl groups, and cyclic alkanes can be substituted with one straight-chain alkane halide or one branched alkane halide, plus additional n-alkyl and/or branched alkyl groups. In another embodiment, the alkyl halides are selected from $C_4$-$C_{16}$ alkyl halides or $C_6$-$C_{12}$ alkyl halides. In other embodiments, the alkyl halides are selected from $C_1$-$C_{20}$ n-alkyl halides (halomethane, haloethane, halopropane, n-halobutane, n-halopentane, n-halohexane, n-haloheptane, n-halooctane, n-halononane, n-halodecane, n-haloundecane, n-halododecane, n-halotridecane, n-halotetradecane, n-halopentadecane, n-halohexadecane, n-haloheptadecane, n-halooctadecane, n-halononadecane, and n-haloeicosane), $C_4$-$C_{16}$ n-alkyl halides, or $C_6$-$C_{12}$ n-alkyl halides. In another embodiment, the foregoing groups of alkyl halides are 1-halo compounds, that is, the halide group is present on the 1-carbon or alpha-carbon of the molecule (halomethane, haloethane, halopropane, 1-halobutane, 1-halopentane, 1-halohexane, 1-haloheptane, 1-halooctane, 1-halononane, 1-halodecane, 1-haloundecane, 1-halododecane, 1-halotridecane, 1-halotetradecane, 1-halopentadecane, 1-halohexadecane, 1-haloheptadecane, 1-halooctadecane, 1-halononadecane, and 1-haloeicosane). In another embodiment, the alkyl halides are selected from $C_1$-$C_{20}$ n-alkane-1-halo compounds. In one embodiment, the halide group of the foregoing compounds is fluoride. In one embodiment, the halide group of the foregoing compounds is chloride. In one embodiment, the halide group of the foregoing compounds is bromide. In one embodiment, the halide group of the foregoing compounds is iodide.

The alkyl-containing molecules can be added to the solution in amounts ranging from about 0.1% to about 25%, for example, about 0.1% to about 20%, about 0.1% to about 15%, about 0.1% to about 10%, about 0.1% to about 7.5%, about 0.1% to about 7.5%, about 0.1% to about 7%, about 0.1% to about 6%, about 0.5% to about 15%, about 1% to about 15%, about 1% to about 10%, about 1% to about 7.5%, about 2% to about 7.5%, about 3% to about 7%, or about 4% to about 6%, or in amounts of about 0.1%, about 0.5%, about 1%, about 2%, about 3%, about 4%, about 5%, about 6%, about 7%, about 8%, about 9%, about 12.5%, about 15%, about 17.5%, about 20%, about 22.5%, or about 25%, or in amounts of up to about 0.1%, up to about 0.2%, up to about 0.5%, up to about 1%, up to about 2%, up to about 3%, up to about 4%, up to about 5%, up to about 6%, up to about 7%, up to about 8%, up to about 9%, up to about 12.5%, up to about 15%, up to about 17.5%, up to about 20%, up to about 22.5%, or up to about 25%. The percentages are preferably calculated as volume/volume; weight/weight, weight/volume, or volume/weight can also be used.

Polyfunctional Alkyl-Containing Compounds

Polyfunctional alkyl-containing compounds can also be used in the invention. In one embodiment, the polyfunctional alkyl-containing compounds exclude di-halo substituted compounds.

In one embodiment, the alkyl-containing molecules can be substituted with at least two functional groups selected from aldehyde (—C(=O)—H), dioxo (i.e., an sp²-hybridized oxygen molecule occupying two valences on a carbon atom to form a ketone, —C(=O)—), hydroxy (—OH), alkoxy (—O—$C_1$-$C_{12}$ alkyl), thiol (—SH), thioalkyl (—S—$C_1$-$C_{12}$ alkyl), carboxylic acid (—COOH), ester (—C(=O))-O—$C_1$-$C_{12}$ alkyl), amine (—NH$_2$, —NH($C_1$-$C_{12}$ alkyl), or —N($C_1$-$C_{12}$ alkyl)$_2$), amide (—C(=O)—NH$_2$, —C(=O)—NH($C_1$-$C_{12}$ alkyl), or —C(=O)—N($C_1$-$C_{12}$ alkyl)$_2$), ether (—O—), thioether (sulfide) (—S—), halide (such as fluoride, chloride, bromide, and iodide), nitrile (—CN), epoxide, aromatic, and arylalkyl groups. Aromatic groups include, but are not limited to, $C_6$-$C_{10}$ aryl groups, such as phenyl, benzyl, and naphthyl groups. Arylalkyl (or aralkyl) groups include, but are not limited to, $C_0$-$C_6$alkyl-$C_6$-$C_{10}$ aryl-$C_0$-$C_6$ alkyl groups. In one embodiment, the polyfunctional alkyl-containing compounds exclude di-halo substituted compounds.

In one embodiment, the polyfunctional alkyl-containing compounds are selected from diols, polyols, dithiols, polythiols, and mixed alcohol-thiol compounds. These polyfunctional alkyl-containing compounds include, but are not limited to, $C_1$-$C_{20}$ alkyl molecules substituted with at least two functional groups, where each of the at least two functional groups are independently chosen from —SH and —OH. The $C_1$-$C_{20}$ alkyl to be substituted with the at least two functional groups can be a straight-chain, branched-chain, or cyclic alkyl, or a combination of straight-chain, branched-chain, and cyclic alkyl moieties. The at least two functional groups chosen from —SH and —OH can be substituted onto any carbon atom in the alkyl moiety. In one embodiment, the at least two functional groups chosen from —SH and —OH are substituted on different carbon atoms; in this embodiment, there must be at least as many carbon atoms as there are total —SH and —OH groups in the molecule. In another embodiment, the polyfunctional alkyl-containing compounds are selected from compounds of the formula $C_{(i+j)}$ alkyl to $C_{20}$ alkyl, where i is zero or a positive integer and designates the number of hydroxy groups, j is zero or a positive integer and designates the number of thiol groups, and (i+j) is an integer between 2 and 20, between 2 and 10, between 2 and 6, or between 2 and 4.

In one embodiment, the polyfunctional alkyl-containing compounds are di-substituted compounds with each substitution on a different carbon atom, such as diols (corresponding to the immediately preceding embodiment with i=2 and j=0), di-thiols (corresponding to the immediately preceding embodiment with i=0 and j=2), or an alkyl-containing compound with one —OH group and one —SH group (corresponding to the immediately preceding embodiment with i=1 and j=1). In one embodiment of these di-substituted compounds, the alkyl-containing compound is an n-alkyl compound, that is, $C_2$-$C_{20}$ n-alkyl substituted with two —OH groups, two —SH groups, or one —OH group and one —SH group. In one embodiment of the di-substituted n-alkyl compounds, the substituents are in the alpha and omega positions, i.e., on the first and last, or terminal, atoms of the n-alkyl chain; that is, $C_2$-$C_{20}$ n-alkyl with alpha, omega substituted —OH groups; or $C_2$-$C_{20}$ n-alkyl with alpha, omega substituted —SH groups; or $C_2$-$C_{20}$ n-alkyl with an alpha —OH group and an omega —SH group (as an n-alkyl group is symmetric, an n-alkyl group with an alpha —OH group and an omega —SH group is equivalent to an n-alkyl with an omega —OH group and an alpha —SH group). In another embodiment, the $C_2$-$C_{20}$ n-alkyl with alpha, omega substituted —SH groups are selected from 1,3-propanedithiol, 1,4-butanedithiol, 1,5-pentanedithiol, 1,6-hexanedithiol, 1,7-heptanedithiol, 1,8-octanedithiol, and 1,9-nonanedithiol.

The polyfunctional alkyl-containing molecules can be added to the solution in amounts ranging from about 0.1% to about 25%, for example, about 0.1% to about 20%, about 0.1% to about 15%, about 0.1% to about 10%, about 0.1% to about 7.5%, about 0.1% to about 7.5%, about 0.1% to about 7%, about 0.1% to about 6%, about 0.5% to about 15%, about 1% to about 15%, about 1% to about 10%, about 1% to about 7.5%, about 2% to about 7.5%, about 3% to about 7%, or about 4% to about 6%, or in amounts of about 0.1%, about 0.5%, about 1%, about 2%, about 3%, about 4%, about 5%, about 6%, about 7%, about 8%, about 9%, about 12.5%, about 15%, about 17.5%, about 20%, about 22.5%, or about 25%, or in amounts of up to about 0.1%, up to about 0.2%, up to about 0.5%, up to about 1%, up to about 2%, up to about 3%, up to about 4%, up to about 5%, up to about 6%, up to about 7%, up to about 8%, up to about 9%, up to about 12.5%, up to about 15%, up to about 17.5%, up to about 20%, up to about 22.5%, or up to about 25%. The percentages are preferably calculated as volume/volume; weight/weight, weight/volume, or volume/weight can also be used.

Organic Semiconductor Films

The organic semiconductor film is typically fabricated with an electron donor material and an electron acceptor material, which allows an electron-hole pair (an exciton) generated by a photon to separate and generate current. The junction between the donor and acceptor can be created by forming a layer of one material (e.g., the donor) on top of the other material (e.g., the acceptor), which forms a planar heterojunction between the bilayers. Interpenetrating networks of donor and acceptor materials can be used, which increase the surface area of the heterojunction, while providing paths for electrons or holes to travel without recombining. Interpenetrating networks can be formed by diffuse interfaces at a bilayer heterojunction, where portions of donor material and acceptor material extend into the other material near the bilayer junction. Bulk heterojunctions can be formed when the donor and acceptor materials are mixed together to form a multi-component active layer. In one embodiment, the organic semiconductor films of the invention are formed as bulk heterojunctions.

In one embodiment, only about 10% or less, about 5% or less, about 2% or less, about 1% or less, about 0.5% or less, about 0.1% or less, about 0.05% or less, about 0.01% or less, about 0.005% or less, or about 0.001% or less of the alkyl-containing molecule additive remains in the organic semiconductor film after fabrication, relative to the original amount of the additive in the solution used to form the semiconductor film. In another embodiment, the alkyl-containing molecule makes up only about 10% or less, about 5% or less, about 2% or less, about 1% or less, about 0.5% or less, about 0.1% or less, about 0.05% or less, about 0.01% or less, about 0.005% or less, or about 0.001% or less by weight of the final organic semiconductor film.

Donor Materials

1) Conjugated Organic Polymers

Conjugated organic polymers typically function as the electron-donating material in the organic semiconductor films, such as in bulk heterojunction films. Examples of suitable conjugated organic polymers which can be used are provided in U.S. Patent Application Publication No. 2005/0279399, which is hereby incorporated by reference in its entirety, particularly with regards to its discussion of conjugated organic polymers. Examples of such conjugated polymers include one or more of polyacetylene, polyphenylenes, poly(3-alkylthiophenes) where alkyl is from 6 to 16 carbons (P3AT's) such as poly-(3-hexylthiophene) (P3HT), poly[2,6-(4,4-bis-(2-ethylhexyl)-4H-cyclopenta[2,1-b;3,4-b']-dithiophene)-alt-4,7-(2,1,3-benzothiadiazole)] (PCPDTBT), polyphenylacetylene, polydiphenylacetylene, polyanilines, poly(p-phenylene vinylene) (PPV) and alkoxy derivatives thereof such as poly(2-methoxy,5-(2'-ethyl-hexyloxy)-p-phenylenevinylene) (MEH-PPV) and poly(2,5-dimethoxy-p-phenylene vinylene) (PDMPV), polythiophenes, poly(thienylenevinylenes) such as poly(2,5-thienylenevinylene), polyfluorenes, polyporphyrins, porphyrinic macrocycles, thiol-derivatized polyporphyrins, polymetallocenes such as polyferrocenes, polyphthalocyanines, polyvinylenes, polyphenylvinylenes, polysilanes, polyisothianaphthalenes, polythienylvinylenes, derivatives of any of these materials and blends or combinations thereof in any proportion. Exemplary derivatives of these materials include derivatives having pendant groups, e.g., a cyclic ether, such as epoxy, oxetane, furan, or cyclohexene oxide. Derivatives of these materials may alternatively or additionally include other substituents.

For example, thiophene components of electron donor may include a phenyl or alkyl group, such as at the 3 position of each thiophene moiety. Examples of such thiophenes are thiophenes of the form

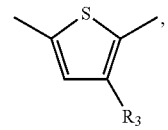

where $R_3$ is $C_1$-$C_8$ alkyl or $C_1$-$C_6$ alkyl-C(=O)—O—$C_1$-$C_6$ alkyl, such as:

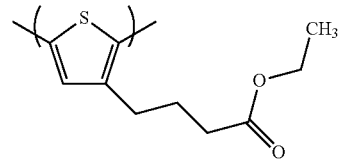

(poly[3-(ethyl-4-butanoate)thiophene-2,5-diyl]). As another example, alkyl, alkoxy, cyano, amino, and/or hydroxy substituent groups may be present in any of the polyphenylacetylene, polydiphenylacetylene, polythiophene, and poly(p-phenylene vinylene) conjugated polymers.

Acceptor Materials

1) Fullerenes

Fullerene compounds typically function as the electron-accepting material in the heterojunction. Exemplary fullerene derivatives for use in the invention include [6,6]-phenyl C61-butyric acid methyl ester (PCBM) and C71-PCBM. Additional commercially available fullerene derivatives which can be used in the invention are shown in the table below.

| Name and Common Abbreviation | Structure |
|---|---|
| Phenyl-$C_{61}$-Butyric-Acid-Methyl Ester, [60]PCBM | |

-continued

| Name and Common Abbreviation | Structure |
|---|---|
| Phenyl-$C_{71}$-Butyric-Acid-Methyl Ester, [70]PCBM | 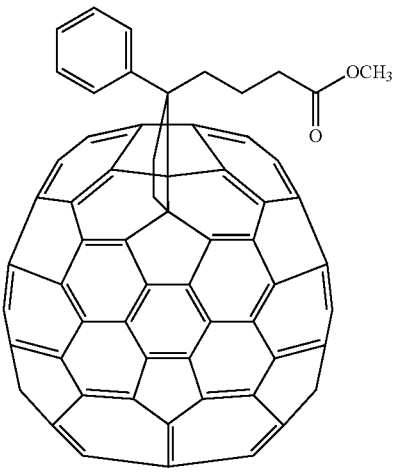 |
| Phenyl-$C_{85}$-Butyric-Acid-Methyl Ester, [84]PCBM | 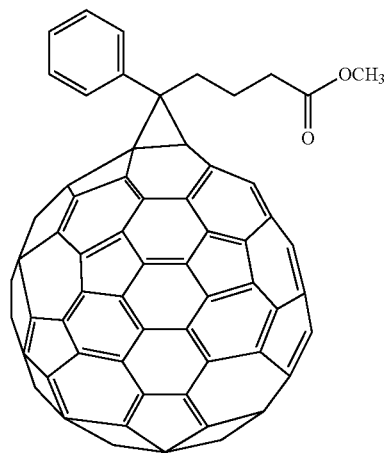 |
| Phenyl-$C_{61}$-Butyric-Acid-Butyl Ester, PCBB, [60]PCB-C4 | 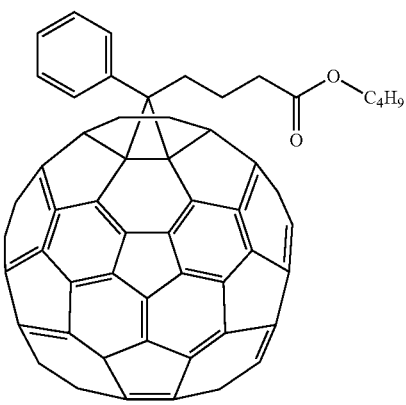 |

-continued

| Name and Common Abbreviation | Structure |
|---|---|
| Phenyl-$C_{61}$-Butyric-Acid-Octyl Ester, PCBO, [60]PCB-$C_8$ | 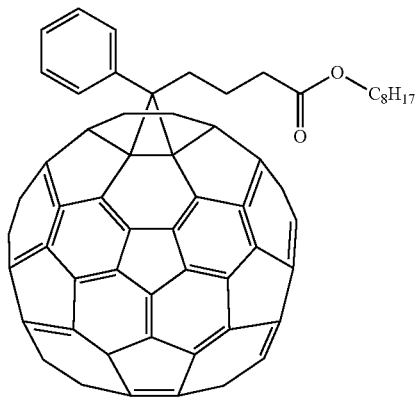 |
| Thienyl-$C_{61}$-Butyric-Acid-Methyl Ester, [60]ThCBM, | 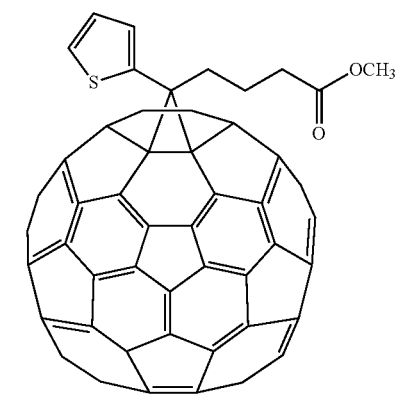 |

In general, fullerenes which can be used in the invention are of the form Ar—C(=fullerene)-$R_1$—C(=O)—$R_2$, diagrammed below, where Ar is phenyl or thienyl, which can be optionally substituted, $R_1$ is $C_1$-$C_{12}$ alkyl (preferably $C_4$ alkyl) and $R_2$ is —O—$C_1$-$C_{12}$ alkyl or —O—$C_1$-$C_{12}$ alkyl-SH. The optional substituents on Ar include, but are not limited to, $C_1$-$C_{12}$ alkyl, F, Cl, Br, I, —O—$C_1$-$C_{12}$ alkyl, and other substituents as indicated above for the low molecular weight alkyl compounds when chemically appropriate. "Fullerene" is selected from a C60, C70, or C84 fullerene moiety.

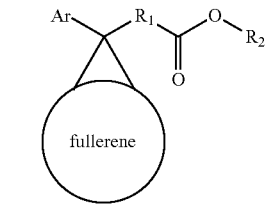

2) Carbon Nanotubes

Carbon nanotubes can also be used as electron acceptors in devices fabricated with the organic semiconducting films disclosed herein. See, for example, Harris, P. J. F., "Carbon Nanotubes and Related Structures," Cambridge University Press, 2002; Dresselhaus, M. S. et al., "Carbon Nanotubes," Springer-Verlag, 2000; U.S. Pat. No. 4,663,230; Guldi, D. et al., Chemical Society Reviews (2006), 35(5), 471-487;

Kymakis, E. et al., Optical Science and Engineering (2005), 99(Organic Photovoltaics), 351-365; and Guldi, D. et al., Accounts of Chemical Research (2005), 38(11), 871-878. Single-walled carbon nanotubes and multi-walled carbon nanotubes are available commercially from a variety of vendors, such as Carbon Solutions, Inc. of Riverside, Calif. and Helix Material Solutions of Richardson, Tex.

3) Other Acceptor Materials

Other materials, such as electron-deficient polymers and electron-deficient molecules, can be used as electron acceptors. Examples of such materials include, but are not limited to, 2,7-poly-(9-fluorenone) (2,7-PFO), pi-conjugated organoboron polymers (U.S. Patent Application Publication No. 2007/0215864), poly(para-phenylene vinylene) modified with cyano groups (Granstrom et al. *Nature* 395, 257-260, 1998); pi-conjugated oxadiazole-containing polymers (Li et al. *J. Chem. Soc. Chem. Commun.* 2211-2212, 1995), pi-conjugated quinoxaline-containing polymers, and pi-conjugated polymers incorporating regioregular dioctylbithiophene and bis(phenylquinoline) units in the backbone of the polymer (Babel, A., Jenekhe, S. A. *Adv. Mater.*, 14, 371-374, 2002).

Solvents

Any suitable solvent can be employed for the solution used to form the conjugated polymer film. A suitable solvent is a solvent in which the components of the film, such as the conjugated polymer, fullerene derivative, and alkyl containing molecule can be dissolved, dispersed or suspended, and from which a conjugated polymer film with the desired properties of photoconductivity can be formed. Solvents including, but not limited to, halogenated alkanes and aromatic and halogenated aromatic compounds, such as chloroalkanes and chlorine-bearing aromatic compounds, can be used in the invention. Examples of suitable solvents include, but are not limited to, chlorobenzene, dichlorobenzene, trichlorobenzene, benzene, toluene, chloroform, dichloromethane, dichloroethane, xylenes such as o-xylene, m-xylene, p-xylene, and mixtures thereof, $\alpha,\alpha,\alpha$-trichlorotoluene, methyl naphthalene, chloronaphthalene, and mixtures thereof.

Formation of Organic Semiconductor Films

The solution used to form the organic semiconductor films, such as conjugated polymer films, can be deposited on a substrate, such as a transparent support or an electrode, by a variety of methods. Such methods include spin casting, "doctor blading," drop-casting, sequential spin-casting, formation of Langmuir-Blodgett films, electrostatic adsorption techniques, and dipping the substrate into the solution. Subsequent processing steps can include evaporation of the solvent to form the film, optionally under reduced pressure and/or elevated temperature; and thermal annealing of the deposited film.

Devices Formed Using Organic Semiconductor Films

A variety of devices can be formed using organic semiconductor films, such as conjugated polymer films, produced with the methods of the invention. Such devices include solar cells, photovoltaic cells, photodetectors, photodiodes, phototransistors, and thin film transistors.

In one embodiment, the devices comprise a first electrode, a second electrode, and an organic semiconductor film between the first and second electrode. The first and second electrodes should have differing work functions; the electrode with the higher work function is designated the high work function electrode while the electrode with the lower work function is designated the low work function electrode. The device can comprise an electrode made out of a material such as transparent indium-tin oxide (ITO) deposited on glass (where ITO serves as the high work function electrode or hole-injecting electrode), the organic semiconductor film, and an electrode made out of a material such as aluminum (where Al serves as the low work function, or electron-injecting, electrode).

In one embodiment, the high work function electrode has a work function at or above about 4.5 electron volts. The high work function electrode is typically a transparent conductive metal-metal oxide or sulfide material such as indium-tin oxide (ITO) with resistivity of 20 ohm/square or less and transmission of 89% or greater at 550 nm. Other materials are available such as thin, transparent layers of gold or silver. This electrode is commonly deposited on a solid support by thermal vapor deposition, electron beam evaporation, RF or Magnetron sputtering, chemical vapor deposition or the like. (These same processes can be used to deposit the low work-function electrode as well.) The principal requirement of the high work function electrode is the combination of a suitable work function, low resistivity and high transparency. In another embodiment, the low work function electrode has a work function at or below about 4.3 eV; examples of such materials include aluminum, indium, calcium, barium and magnesium. Either of the electrodes can be fabricated by deposition onto a support, for example, indium-tin oxide deposited on a glass or plastic substrate, or the electrodes can be fabricated without a support.

The invention will be further understood by the following nonlimiting examples.

EXAMPLES

Example 1

Fabrication and Evaluation of Cells

PCBM was synthesized as described in the literature (J. C. Hummelen, B. W. Knight, F. LePeq, F. Wudl, *J. Org. Chem.* 1995, 60, 532), P3HT was purchased from Rieke metals, Baytron P was purchased from H. C. Starck, and all other chemicals were purchased from Sigma/Aldrich and were used as received. Glass slides coated with indium tin oxide were rinsed with soap and water and sonicated once in soapy water, three times in deionized water, and once in each of isopropyl alcohol and acetone for ten minutes prior to being dusted with a nitrogen gun and dried overnight. Prior to spin coating samples were cleaned under UV/Ozone for 30 minutes and dusted again with nitrogen. A layer of Baytron P Poly(ethylene dioxythiophene):Poly(styrene sulfonate) was spin coated at room temperature under atmosphere at 5000 RPM for one minute and then dried at 120° C. for 15 minutes. Devices were then transferred to a glove box which is maintained at less than 5 ppm of $O_2$. Active layer solutions were prepared by dissolving 1% P3HT and 0.8% PCBM by weight in toluene and allowing the solutions to stir at 70° C. overnight. Alkyl thiol solutions were prepared by adding the appropriate volume of alkyl thiol to the solvent prior to the dissolution of the P3HT and PCBM. The active layers were applied by spin coating at 700 RPM for one minute. The devices were then moved into a second glove box maintaining an oxygen concentration of less than 1 ppm where the aluminum cathode was deposited at a pressure of less that $1\times10^{-6}$ ton at an initial rate of no more than 0.15 nm/sec to a total thickness of at least 120 nm. Annealing was conducted at 150° C. for 15 minutes by placing the devices on a hotplate. The same general technique was used to fabricate cells in the rest of the Examples, with variations in the components as indicated in each Example.

Efficiency testing was conducted as described previously (U. Zhokhavets, T. Erb, H. Hoppe, G. Gobsch, N. S. Sariciftci, *Thin Solid Films* 2006, 496, 679). TEM images obtained at 80 kV on a Philips CM 10 using copper grids ordered from Ted Pella Inc. with samples prepared as described above. Optical transmission studies were conducted by spin coating the device active layers on glass and scanning in a Shimadzu UV-2401PC UV-Visible spectrophotometer. Atomic force microscopy was conducted on a Veeco multimode AFM in tapping mode where thicknesses were determined by the scratch method.

The samples for steady-state and transient photoconductivity measurements were spin cast on alumina substrates and the electrodes were deposited in the surface-contact, Auston switch configuration (D. H. Auston, *IEEE Journal of Quantum Electronics* 1983, 19, 639). Steady-state photoconductivity was measured by a standard modulation technique (C. H. Lee, G. Yu, D. Moses, K. Pakbaz, C. Zhang, N. S. Sariciftci, A. J. Heeger, F. Wudl, *Phys. Rev. B* 1993, 48(20) 15425), where the excitation was provided by a Xenon lamp, the modulation frequency was 166 Hz and the applied electric field was E=5 KV/cm. All the measurements were performed while the samples were kept in vacuum (P<$10^{-4}$ Torr).

For convenience, samples are designated by their composition and thermal history. Samples are designated bulk heterojunction, or BHJ, which indicates a 10:8 ratio of P3HT and PCBM spun cast from toluene at 700 RPM. The BHJ is followed by a concentration number and alkyl thiol chain length; for example, BHJ-5% C8 is a 10:8 P3HT:PCBM film spun cast from a toluene solution containing 5% by volume octanethiol. Unless otherwise designated, PCBM indicates C60-PCBM. After the composition of the solvent mixture, there will either be an A or an NA to designate if the sample has been annealed or not, respectively. For this work, the device fabrication method described by W. Ma et al., *Adv. Func. Mater.* 2005, 15, 1617, was used, except that toluene was used as the solvent. Devices had an active layer thickness of about 100 nm, as measured by atomic force microscopy (AFM). Under a calibrated AM 1.5 solar illumination source, the control devices were, on average, 2% efficient prior to annealing (BHJ-NA) and 3.3% efficient after annealing at 150° C. for 15 minutes (BHJ-A).

FIG. 1 displays the differences in the transmittance of BHJ-0.75% C8-NA and BHJ-0.75% C8-A, as compared to BHJ-NA and BHJ-A. Incorporation of n-octanethiol to the P3HT/PCBM/toluene solution (between 0.1% and 10% by volume) leads to a decrease of the transmittance, similar to that observed after thermal treatment (BHJ-A) (W. Ma et al., *Adv. Func. Mater.* 2005, 15, 1617; D. Chirvase et al., *Nanotechnology* 2004, 15, 1317). The enhancement of the transmittance of BHJ-0.75% C8-NA relative to BHJ-NA may arise from increased optical absorption due to more pronounced interchain interactions, leading to absorption of incident light perpendicular to the substrate or enhanced light scattering in the film; the latter process might also contribute also to increased absorption as well due to multiple scattering in the active layer (T. Q. Nguyen et al., *J. Phys. Chem. B.* 2000, 104, 237). A similar decrease in transmission can be observed by mixing octanol or undecane in the toluene solution prior to spin casting. Due to the fact that a similar effect is observed for both nonpolar and polar additives, it seems unlikely that the changes in transmittance are due to solvatochromic effects resulting from residual solvent molecules.

Figure 2:
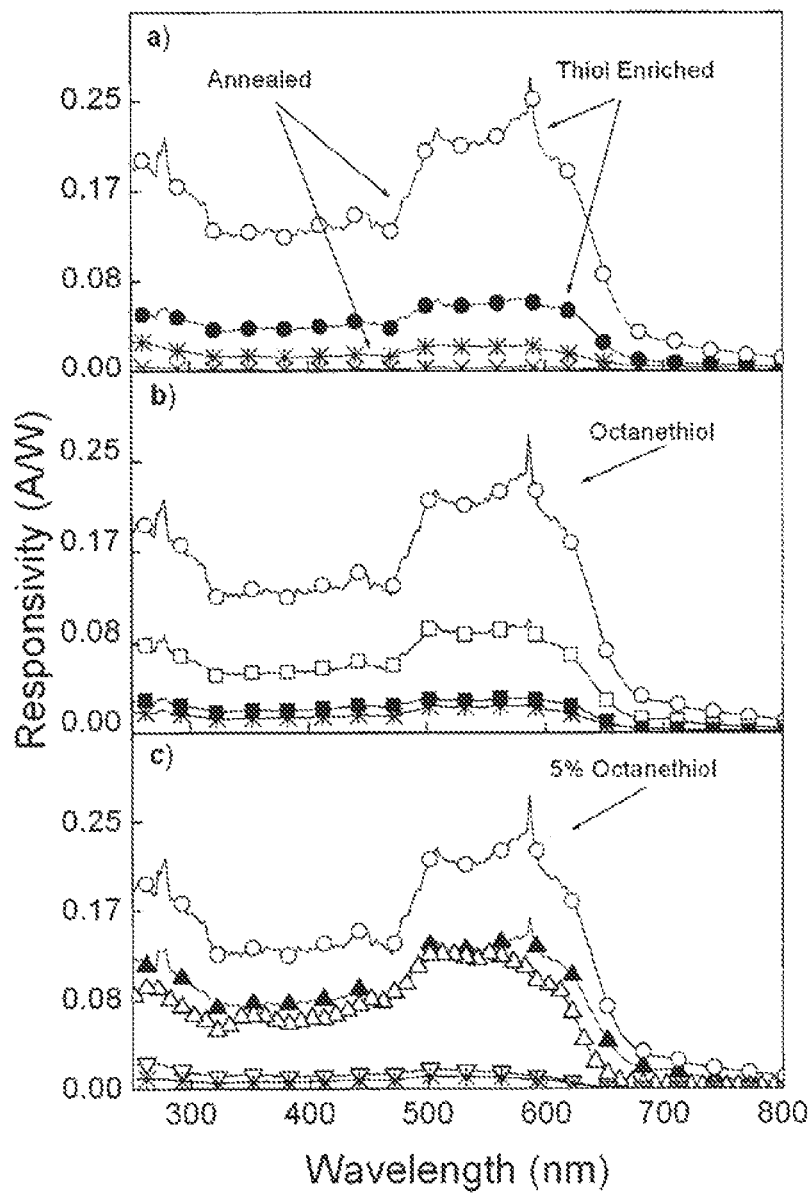
FIG. 2 depicts the effect on photoconductivity of (FIG. 2a) annealing and enrichment with 5% n-octanethiol.

Steady-state photoconductivity measurements were performed as a function of annealing (FIG. 2a), alkyl chain length (FIG. 2b), and alkyl thiol concentration (FIG. 2c). The photoconductive response is presented in terms of sample responsivity (R), i.e. photocurrent/incident light power (mA/W), as measured using an external field of F=5 KV/cm. FIG. 2(a) shows that while annealing increases the responsivity of sample BHJ-NA by a factor of 6, inclusion of 5% n-octanethiol in solution combined with annealing increases the responsivity of sample BHJ-NA by a factor of 60. FIG. 2(b) shows that utilizing n-octanethiol results in higher responsivity than n-dodecanethiol or n-hexanethiol; FIG. 2(c) shows that among the concentrations of n-octanethiol tested, the sample obtained from a 5% by volume solution led to the highest responsivity.

The steady-state photoconductivity is given in Equation 3, where e is the charge of an electron, n is the number of either electrons or holes, µ is the carrier mobility, and τ is the carrier lifetime (C. H. Lee et al., *Synt. Met.*, 1995, 70, 1353; D. Moses et al., *Synt. Met.*, 1997, 84, 539; C. Y. Yang et al., *Synt. Met.*, 2005, 155, 639).

$$\sigma = e[(n_h \mu_h \tau_h) + (n_e \mu_e \tau_e)] \quad \text{(Equation 3)}$$

Photoconductivity of pristine P3HT has previously been shown to increase by more than two orders of magnitude with the addition of the fullerene due to the ultrafast transfer of photoexcited electrons from the P3HT to the fullerene, which increases the number of separated carriers (n) and carrier life time. Upon annealing, a further increase in photoconductivity by a factor of 6 was observed.

From the maximum responsivity measured in BHJ-5% C8-A at 590 nm, and taking into account the device cross sectional area of $6 \times 10^{-7}$ cm$^2$, a photocurrent density per Watt of incident radiation of J=$4 \times 10^5$ A/cm$^2$ was estimated. This magnitude of J corresponds to a photoconductivity per Watt of incident radiation of $\sigma$=200 S/cm at E=5 KV/cm. Assuming that the number of carriers scales with optical absorption and given that the transmission spectra of the BHJ-A samples are similar to the thiol-modified samples, it follows from Equation 3 that processing with alky thiols modifies the product of carrier mobility and carrier lifetime.

To disentangle the effects of the alkyl thiols on the charge carrier mobility and carrier lifetime, fast (t≥100 ps) transient photoconductivity measurements were performed from which the lifetime was directly determined. The measured carrier lifetime increases from 36 ns in BHJ-NA to 65 ns in BHJ-A. This corresponds to a factor of 1.8 improvement in the carrier lifetime due to annealing, while adding alkyl thiol to the solution increased the lifetime by only a factor of 1.3. Both the magnitude of the transient photocurrent waveforms and the photocurrent decay rate are consistent with the magnitude of the steady-state photocurrents. Thus, annealing and processing using alkyl thiol result in similar increases in the carrier lifetime; however, since the photocurrent measured in BHJ-C8-NA was significantly higher than that in the BHJ-A sample, it can be concluded that the carrier mobility is increased by processing with alkyl thiol.

Figure 3:
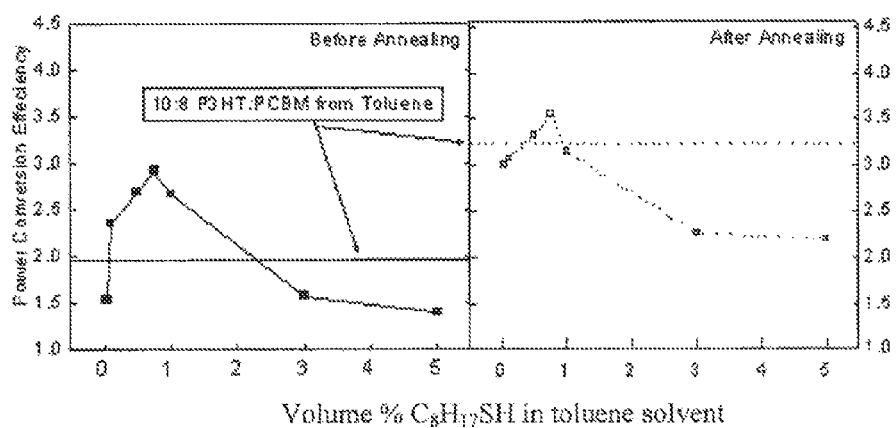
FIG. 3 depicts a comparison of device efficiencies for the BHJ-C8-NA series (solid squares (■) and solid lines), and the BHJ-C8-A series (open squares (□) and dashed lines). The flat lines are the efficiencies obtained using BHJ-NA and BHJ-A. (C8 indicates 1-octanethiol.)

Measurements of the photovoltaic device efficiency were conducted to characterize the effects of the thiol solution on solar cell device performance. FIG. 3 shows how the power conversion efficiency ($\eta_e$) is affected by the inclusion of alkyl-thiol molecules, as compared to BHJ-NA and BHJ-A samples. Maximum increase in efficiency occurred at an alkyl thiol concentration of 0.75 vol %. At this concentration, the efficiency increased by 50% over the control device prior to thermal annealing and the efficiency then increased by 20% after thermal annealing. Note that the improvements relative to the control samples shown in FIG. 3 are smaller than the ones observed in the photoconductivity measurements in FIG. 2.

It is interesting to note that photoconductivity improvements do not necessarily translate directly to solar cell efficiency improvements. One possible reason to account for this difference is that spinning from a solution containing thiol yields films which have greatly improved charge transport properties in the direction parallel to the substrate, but not in the direction perpendicular to the substrate. Because the photoconductivity studies were conducted with surface electrodes, whereas solar cell devices are operated through the thickness of the film, anisotropy of charge transport properties could account for the difference in photoconductivity enhancement and device efficiency enhancement. Another possible explanation is that because this solar cell device structure has been optimized such that the thickness is comparable to the carrier diffusion length, device efficiency may not be greatly limited by carrier mobility.

To test the extent to which carrier diffusion length influences efficiency, devices were prepared with twice the concentration of P3HT and PCBM and 1 vol % n-octanethiol to create a thicker device active layer (W. Ma et al., *Adv. Func. Mater.* 2005, 15, 1617; G. Li et al., *J. Appl. Phys.,* 2005, 98, 043704). The devices were approximately 200 nm thick and showed increased short circuit currents due to increased absorption. Device efficiencies were 3.6% before annealing and 4.0% after annealing. These values should be compared to a 100 nm thick control which was 2.0% efficient before annealing and 3.3% efficient after annealing. Due to the decrease in the built-in field, however, the $V_{oc}$ dropped to 0.58 V from 0.61 V and the fill factor dropped to 59% from 65%.

As indicated above, peak device efficiency occurs slightly under 1% by volume of alkyl thiol in solution for 100 nm thick devices. The reason for the disparity in optimum alkyl thiol concentrations between the efficiency measurements and the photoconductivity measurements is believed to be due to excess alkyl thiol being squeezed to the surface in the higher concentration samples. Examination of the films by AFM showed droplets on the surface of the films from solutions with alkyl thiol concentrations greater than one percent by volume. The surface contact geometry used in the photoconductivity setup would be less sensitive to islands of poor conductivity between the deposited electrode and the active layer.

One possible explanation for the effects observed is that alkyl chains act as a compatibilizer by lubricating the P3HT chains during the highly dynamic and kinetically limited spin coating process. This processing technique can be used as a tool elucidate the factors that affect interchain order in the P3HT phase and the blend morphology of P3HT and PCBM mixtures.

The following table summarizes current-voltage characteristic of solar cells made of regio-regular polythiophene (P3HT)/PCBM cast from chlorobenzene, with and without a solvent additive.

| Thickness (nm) | $V_{oc}$ (V) | $I_{sc}$ (mA/cm$^2$) | FF (%) | PCE (%) | Solvent |
|---|---|---|---|---|---|
| 120 NA | 0.6 | −5.6 | 0.48 | 2.1 | CB |
| 120 NA | 0.53 | −8.6 | 0.61 | 3.5 | CB/1% C8SH |
| 120 A | 0.65 | −8.1 | 0.61 | 4.0 | CB |
| 120 A | 0.64 | −8.5 | 0.64 | 4.4 | CB/1% C8SH |
| 220 NA | 0.65 | −4 | 0.38 | 1.3 | CB |
| 220 NA | 0.52 | −10.4 | 0.51 | 3.4 | CB/2.5% C8SH |
| 220 A | 0.62 | −9.4 | 0.53 | 3.9 | CB |
| 220 A | 0.63 | −10.8 | 0.57 | 4.8 | CB/2.5% C8SH |

Example 2

Thin Film Transistors

Figure 4:
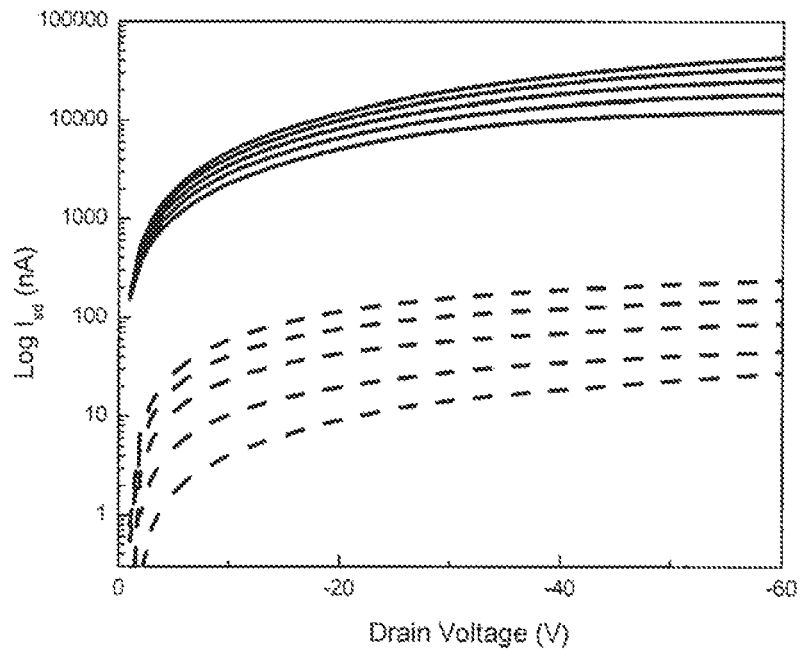
FIG. 4 depicts transistor behavior of films in log scale: BHJ-NA (dashed line) and BHJ-5% C8-NA (solid line) at gate voltages of 0, −7.5, −15, −22.5, and −30 Volts.

FIG. 4 shows the behavior of transistors fabricated from semiconductor films (BHJ-NA, dashed lines, and BHJ-5% C8-NA, solid lines). TFT devices were spun at 2000 rpm on heavily doped n-type Si coated with a 200 nm silica dielectric layer treated with octyltrichlorosilane. The source and drain electrodes comprised of 50 nm thick Au deposited on a 5 nm thick Ti adhesion layer in a bottom contact geometry; the TFT channel lengths were 5 or 10 μm and the channel width was 1 mm. Films fabricated with addition of 5% octanethiol show dramatic increases in current at each voltage tested.

Example 3

X-Ray Diffraction Results

Figure 5:
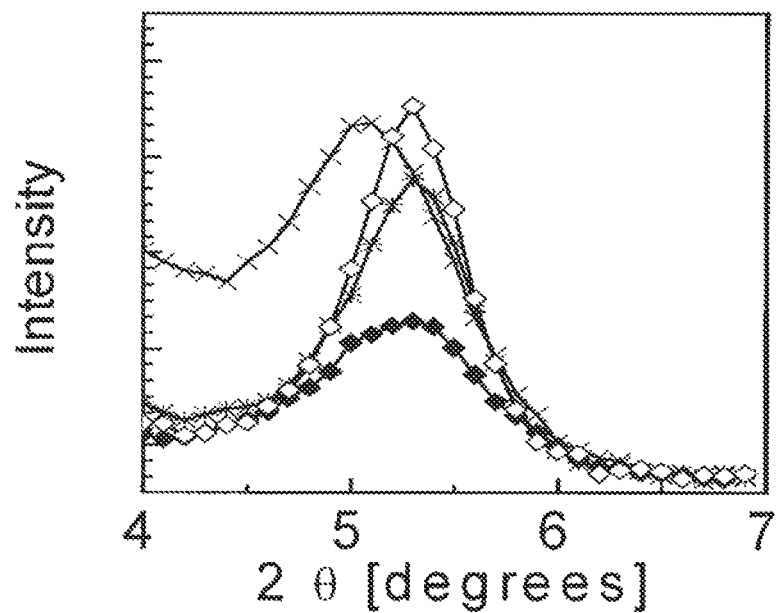
FIG. 5 depicts X-ray diffraction results highlighting the <100> diffraction peak for P3HT in P3HT/PCBM films cast from Toluene BHJ-NA (x's, X), BHJ-A (asterisks or *, ✳), BHJ-0.75% C8-NA (filled diamonds, ◆), and BHJ-0.75% C8-A (open diamonds, ◇).
Figure 30:
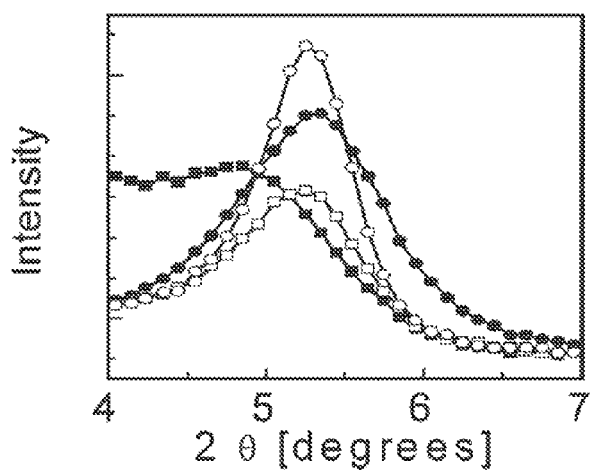
FIG. 30 depicts X-ray diffraction results highlighting the <100> diffraction peak for P3HT in P3HT/C-60 PCBM films cast from chlorobenzene (squares) or chlorobenzene containing 2.5% octanethiol (circles) either before annealing (closed shapes) or after annealing (open shapes).

FIG. 5 and FIG. 30 show the results of X-ray diffraction studies on films processed with and without additive and with or without annealing. Films for X-ray diffraction were spun on glass substrates. Both annealing and use of additive induce significant changes in the X-ray diffraction pattern as compared to the non-annealed film cast without additive, indicative of underlying changes in film structure. FIG. 5 depicts X-ray diffraction results highlighting the <100> diffraction peak for P3HT in P3HT/PCBM films cast from toluene BHJ-NA (x's, X), BHJ-A (asterisks or *,✷), BHJ-0.75% C8-NA (filled diamonds, ◆), and BHJ-0.75% C8-A (open diamonds, ◇). FIG. 30 depicts X-ray diffraction results highlighting the <100> diffraction peak for P3HT in P3HT/C-60 PCBM films cast from chlorobenzene (squares) or chlorobenzene containing 2.5% octanethiol (circles) either before annealing (closed shapes) or after annealing (open shapes). The films are cast using toluene (FIG. 5) and chlorobenzene (FIG. 30), indicating that the solvent from which the films are cast also affects the structure of the films.

Example 4

Photocurrent Transients

Figure 6:
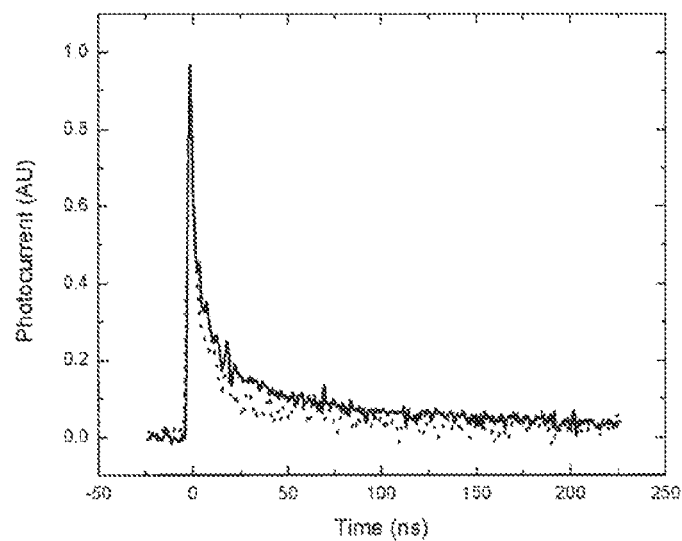
FIG. 6 depicts normalized transient photocurrent waveforms (at the peak) of films: BHJ-NA (dotted line) and BHJ-1% C8-NA (solid line).
Figure 7:
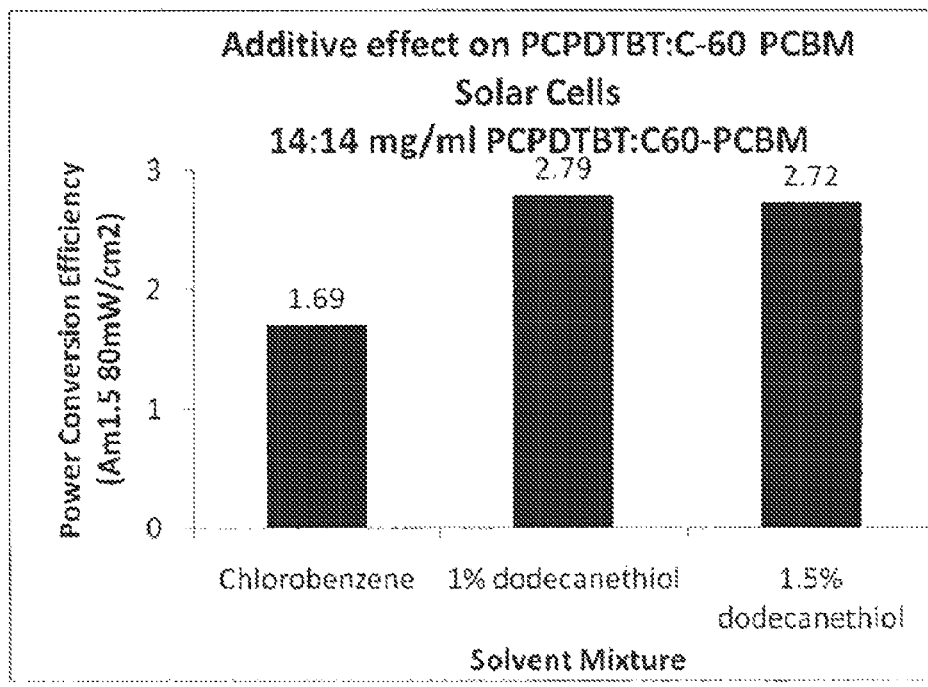
FIG. 7 depicts the effect of dodecane thiol additive (0% or control, 1%, 1.5% v/v) on the power conversion efficiency of solar cells fabricated from PCPDTBT and Phenyl-C60 butyric acid methyl ester (14:14 mg/ml) cast from chlorobenzene.
Figure 8:
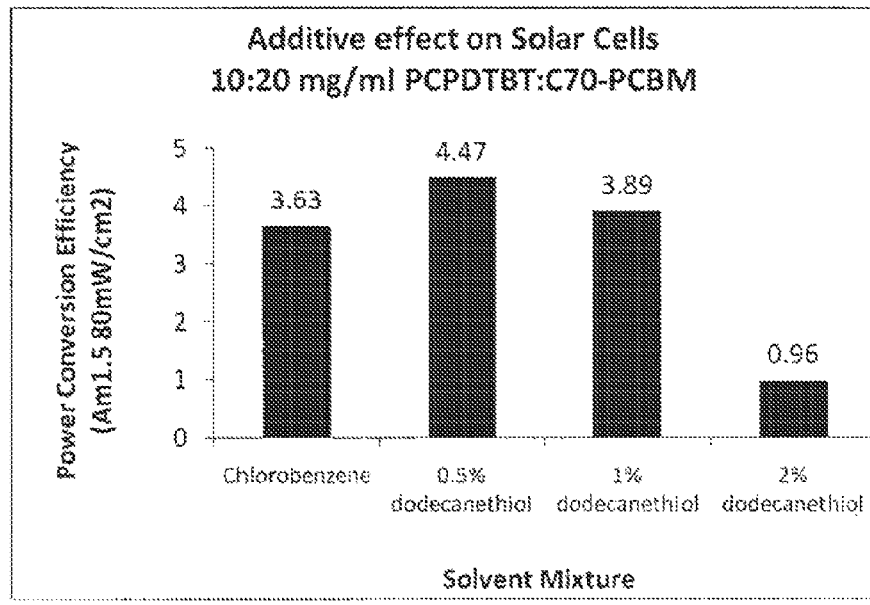
FIG. 8 depicts the effect of dodecane thiol additive (0% or control, 0.5%, 1%, 2% v/v) on the power conversion efficiency of solar cells fabricated from PCPDTBT and Phenyl-C70 butyric acid methyl ester (10:20 mg/ml) cast from chlorobenzene.
Figure 9:
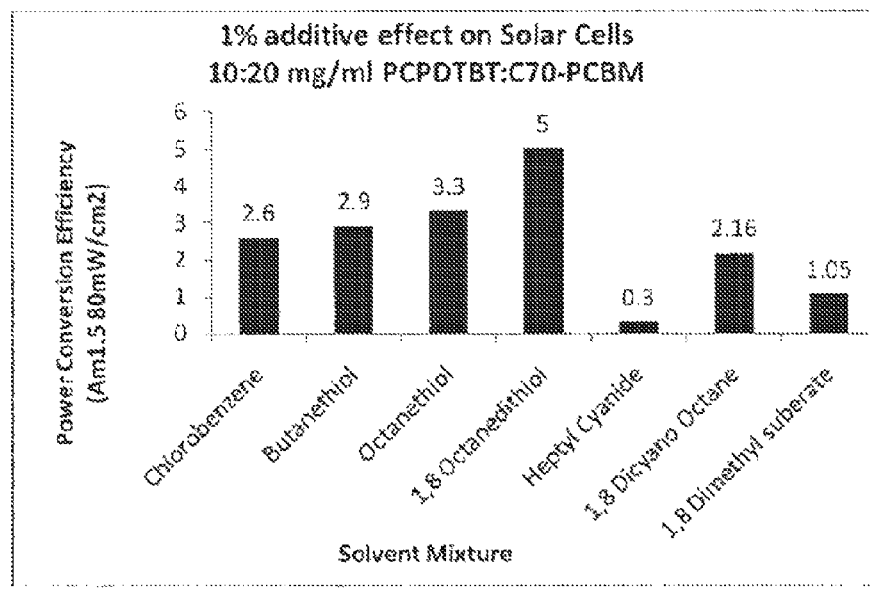
FIG. 9 depicts the effect of various additives at 1% (butanethiol, octanethiol, 1,8-octanedithiol, heptyl cyanide, 1,8-dicyanooctane, 1,8-dimethyl suberate), as well as for solvent without additive, on the power conversion efficiency of solar cells fabricated from PCPDTBT and Phenyl-C70 butyric acid methyl ester cast from chlorobenzene.
Figure 10:
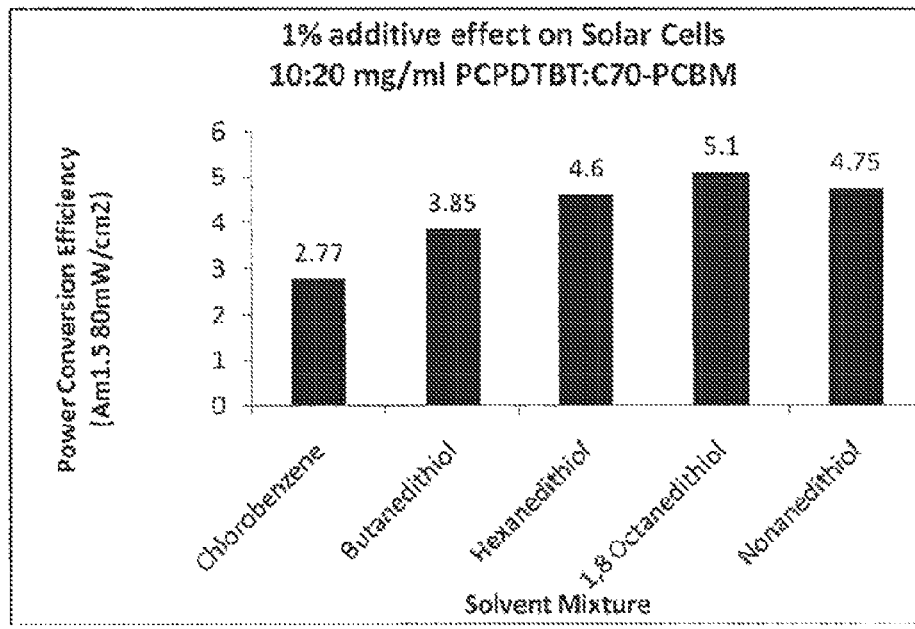
FIG. 10 depicts the effect of various dithiol additives (1,4-butanedithiol, 1,6-hexanedithiol, 1,8-octanedithiol, 1,9-nonanedithiol), as well as for solvent without additive, on the power conversion efficiency of solar cells fabricated from PCPDTBT and Phenyl-C70 butyric acid methyl ester cast from chlorobenzene.
Figure 11:
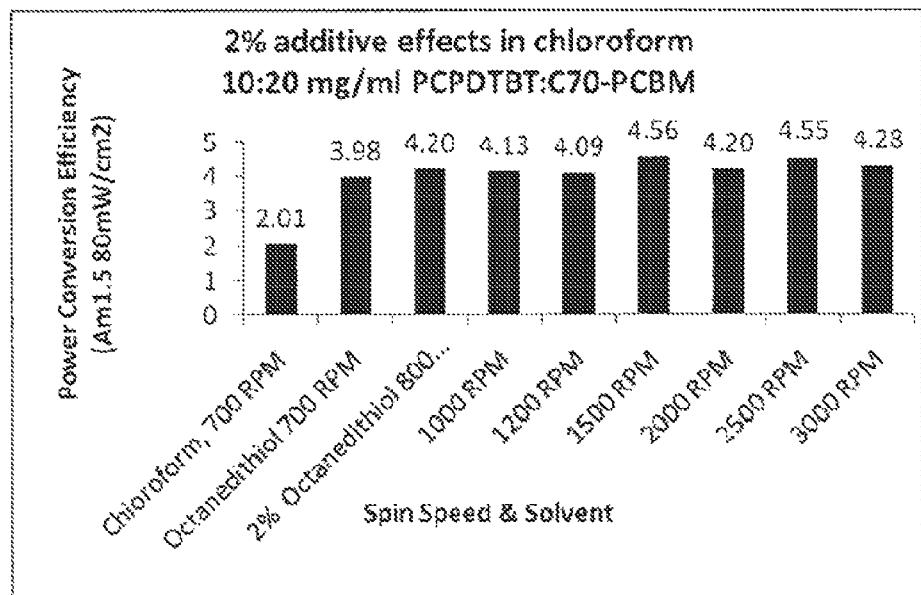
FIG. 11 depicts the effect of different spin speeds for spin-casting of 2% dithiol solutions, as well as for solvent without additive, on the power conversion efficiency of solar cells fabricated from PCPDTBT and Phenyl-C70 butyric acid methyl ester cast from chloroform.
Figure 12:
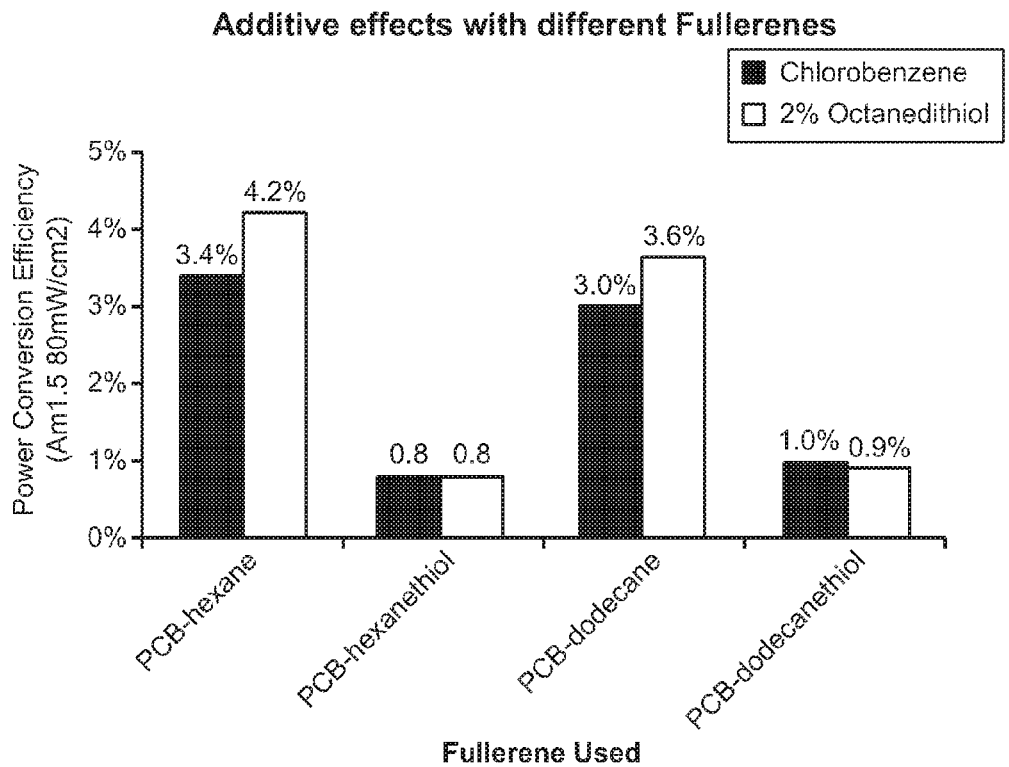
FIG. 12 depicts the effect of different fullerene acceptors on the power conversion efficiency of solar cells fabricated using PCPDTBT donor cast from chlorobenzene with and without 2% octanedithiol.
Figure 13:
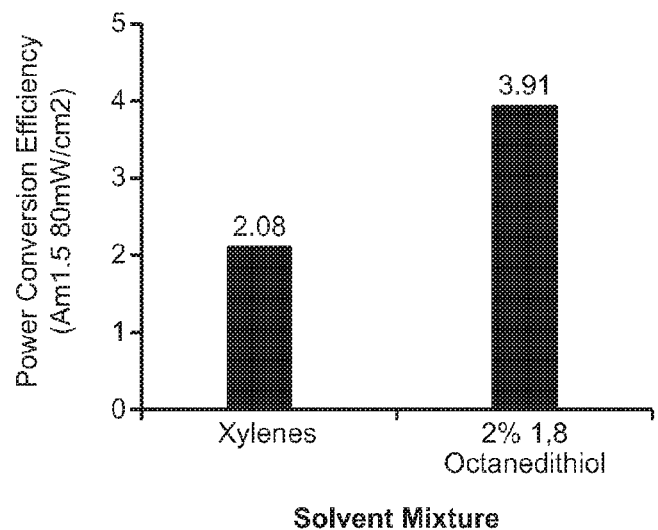
FIG. 13 depicts the effect of 2% 1,8-octanedithiol on the power conversion efficiency of solar cells fabricated from PCPDTBT and Phenyl-C70 butyric acid methyl ester cast from xylene, as well as for solvent without additive.
Figure 14:
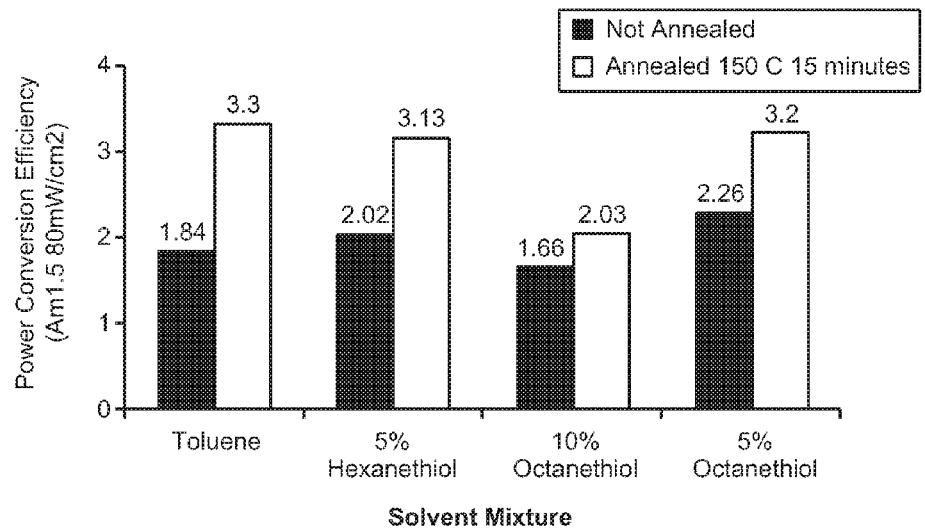
FIG. 14 depicts the effect of different additives (hexanethiol and octanedithiol), as well as for solvent without additive, on the power conversion efficiency of solar cells fabricated from P3HT and Phenyl-C60 butyric acid methyl ester cast from toluene before and after annealing.
Figure 15:
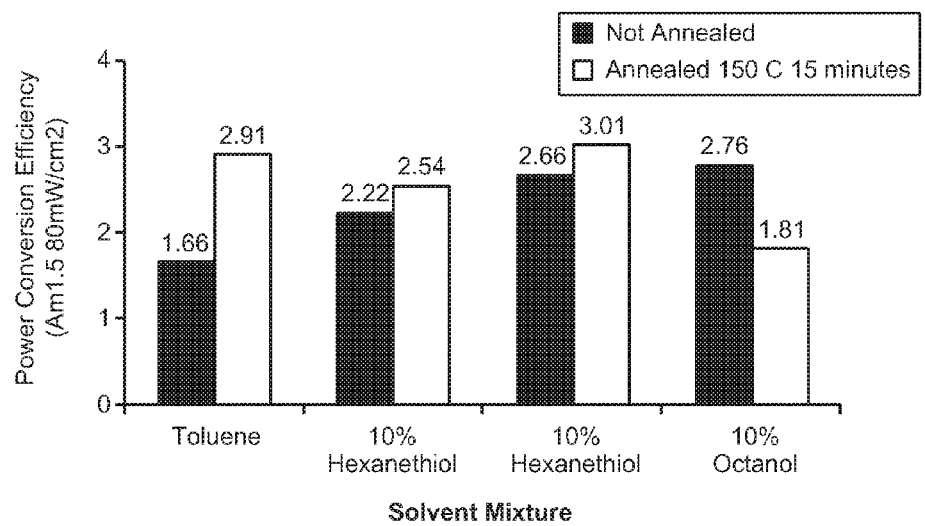
FIG. 15 depicts the effect of different additives (hexanethiol and octanol), as well as for solvent without additive, on the power conversion efficiency of solar cells fabricated from P3HT and Phenyl-C60 butyric acid methyl ester cast from toluene before and after annealing.
Figure 16:
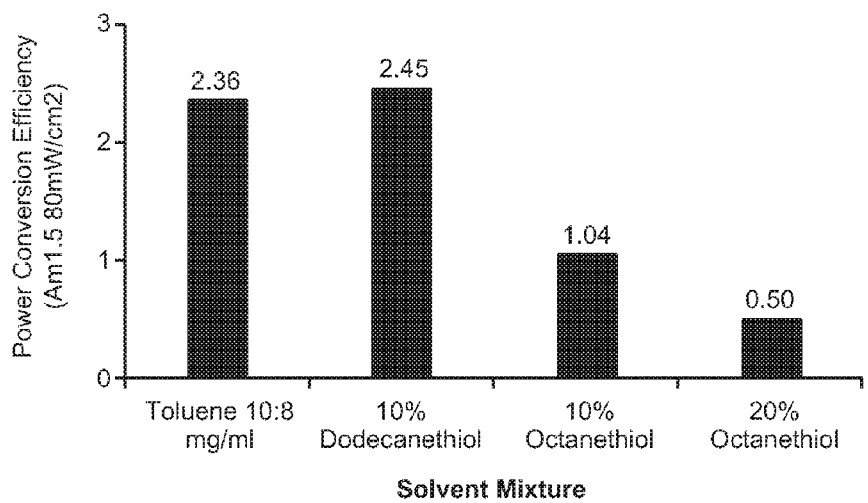
FIG. 16 depicts the effect of different additives (dodecanethiol and octanethiol), as well as for solvent without additive, on the power conversion efficiency of solar cells fabricated from P3HT and Phenyl-C60 butyric acid methyl ester cast from toluene after annealing.
Figure 17:
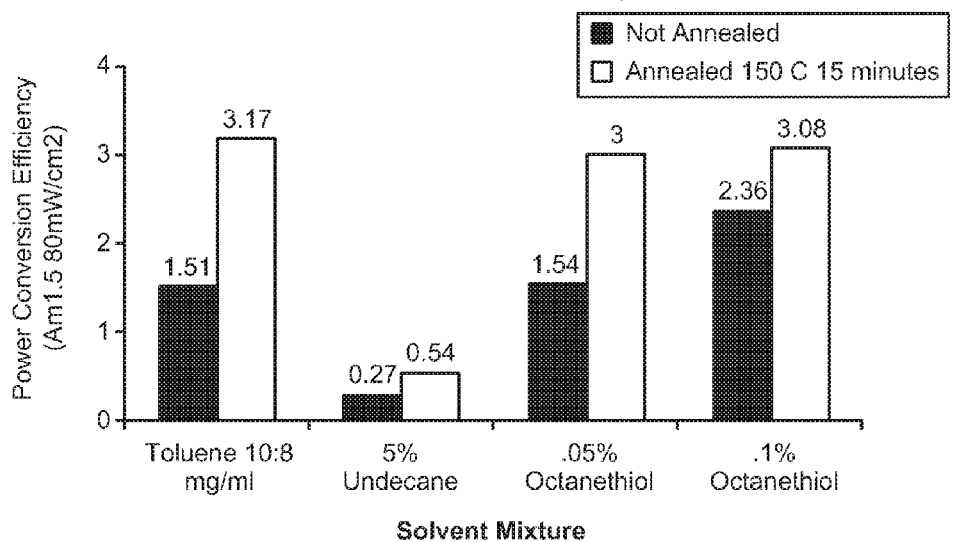
FIG. 17 depicts the effect of different additives (octanethiol and undecane), as well as for solvent without additive, on the power conversion efficiency of solar cells fabricated from P3HT and Phenyl-C60 butyric acid methyl ester cast from toluene before and after annealing.
Figure 18:
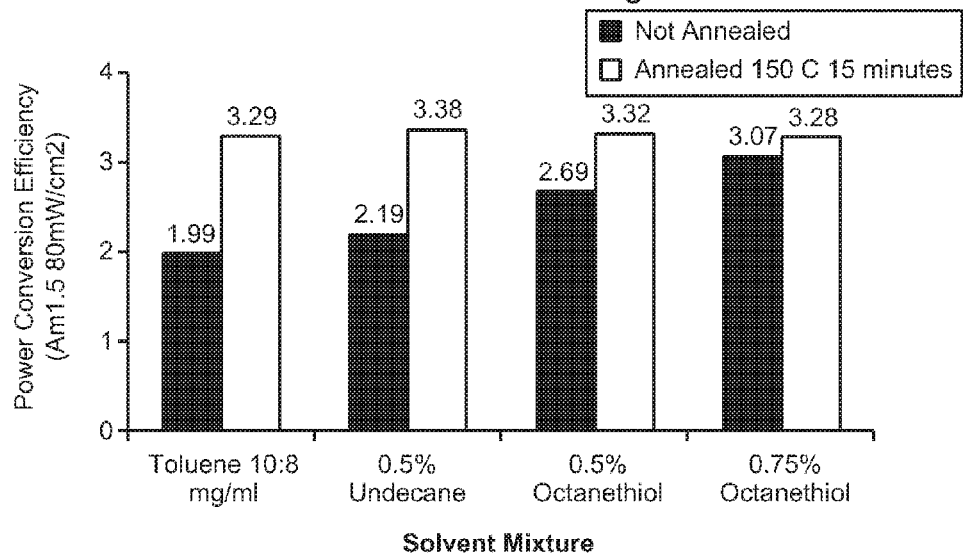
FIG. 18 depicts the effect of different additives (octanethiol and undecane), as well as for solvent without additive, on the power conversion efficiency of solar cells fabricated from P3HT and Phenyl-C60 butyric acid methyl ester cast from toluene before and after annealing wherein undecane has a positive effect on device performance.
Figure 19:
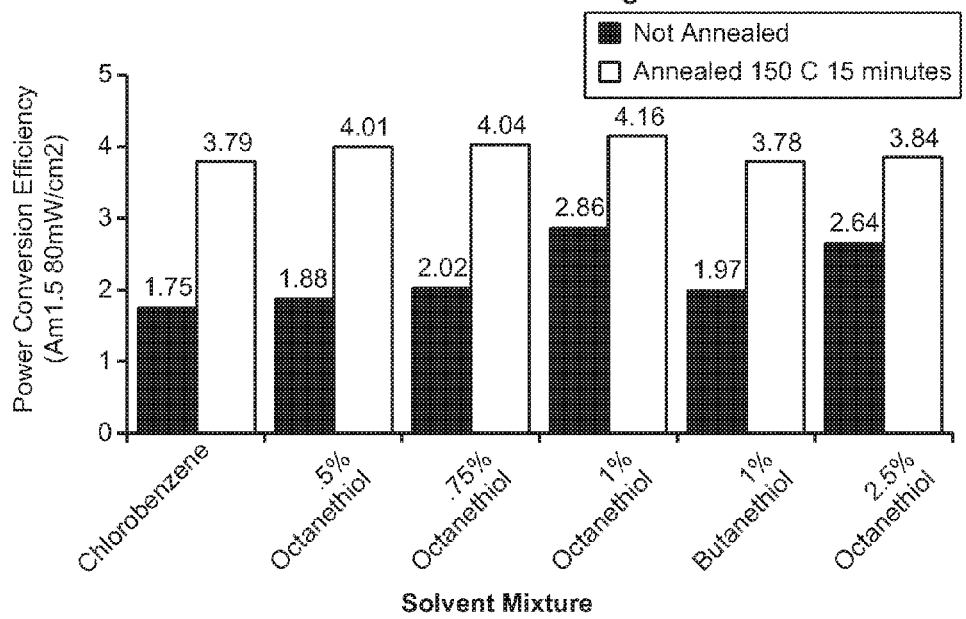
FIG. 19 depicts the effect of different additives (octanethiol and butanethiol), as well as for solvent without additive, on the power conversion efficiency of solar cells fabricated from P3HT and Phenyl-C60 butyric acid methyl ester cast from chlorobenzene before and after annealing.
Figure 20:
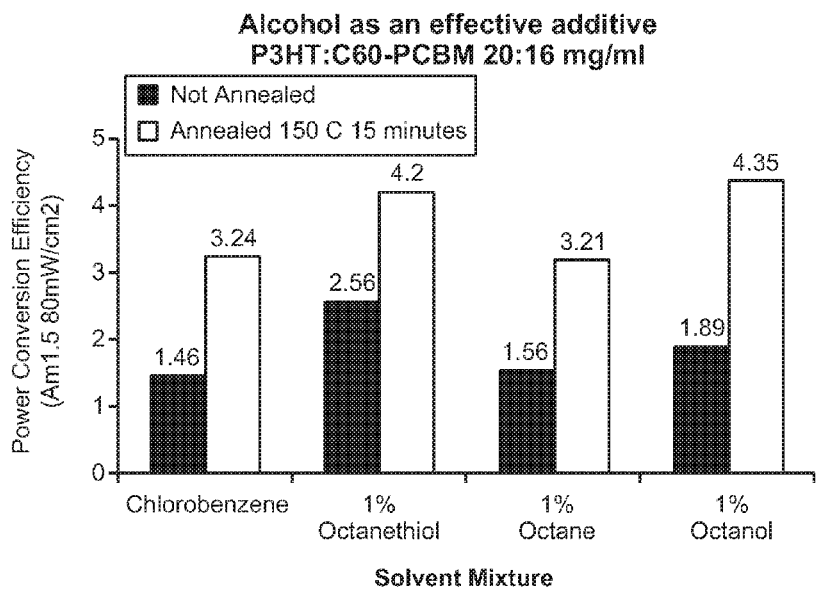
FIG. 20 depicts the effect of different additives (octanol, octane, and octanethiol, each at 1%; solvent only, without additive, is displayed for comparison at left) on the power conversion efficiency of solar cells fabricated from P3HT and Phenyl-C60 butyric acid methyl ester cast from chlorobenzene before and after annealing wherein octanol has a positive effect on device performance.
Figure 21:
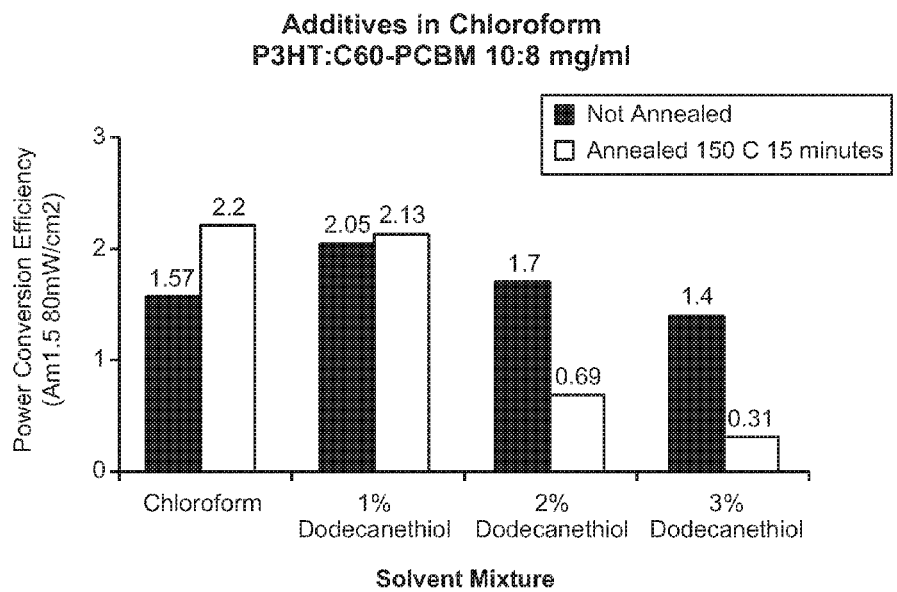
FIG. 21 depicts the effect of dodecanethiol, at 1%, 2%, and 3% (solvent only, without additive, is displayed for comparison at left), on the power conversion efficiency of solar cells fabricated from P3HT and Phenyl-C60 butyric acid methyl ester cast from chloroform before and after annealing.
Figure 22:
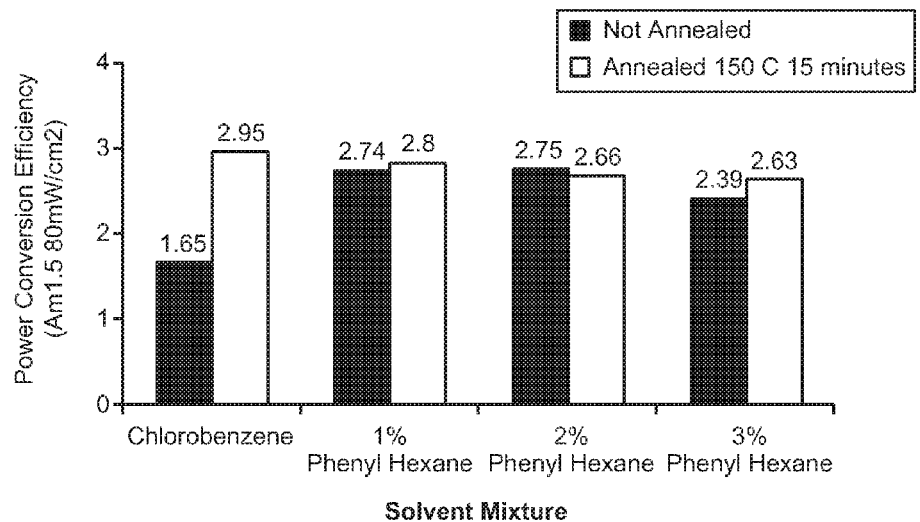
FIG. 22 depicts the effect of phenylhexane, at 1%, 2%, and 3% (solvent only, without additive, is displayed for comparison at left), on the power conversion efficiency of solar cells fabricated from P3HT and Phenyl-C60 butyric acid methyl ester cast from chlorobenzene before and after annealing.
Figure 23:
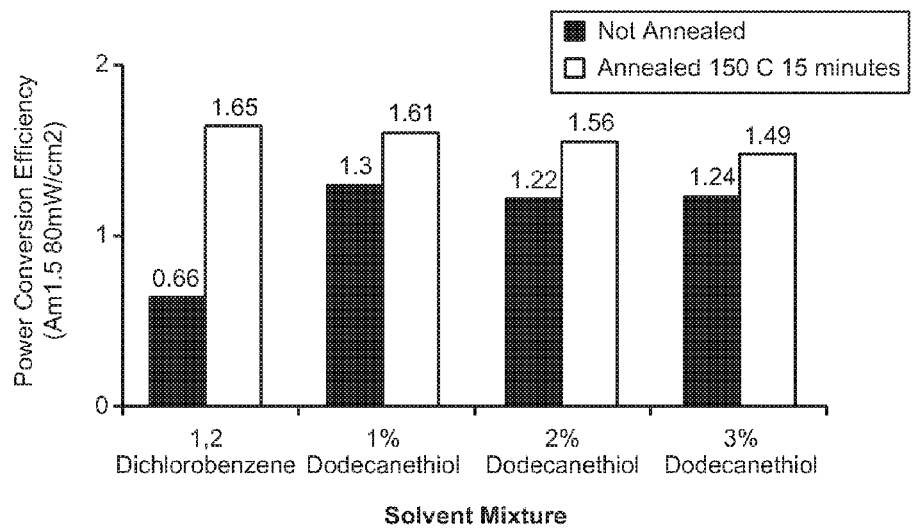
FIG. 23 depicts the effect of dodecanethiol, at 1%, 2%, and 3% (solvent only, without additive, is displayed for comparison at left), on the power conversion efficiency of solar cells fabricated from P3HT and Phenyl-C60 butyric acid methyl ester cast from 1,2 dichlorobenzene before and after annealing.
Figure 24:
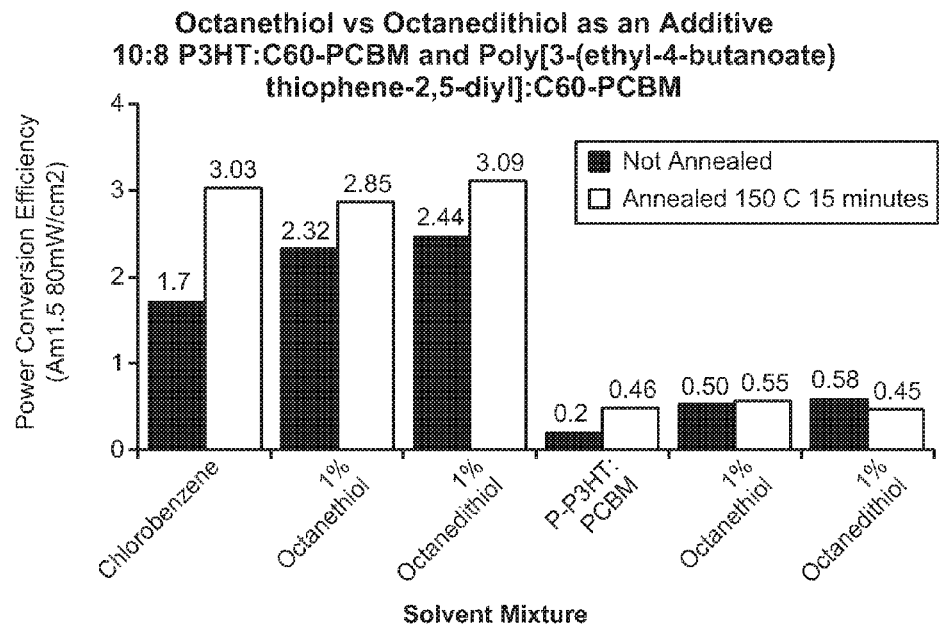
FIG. 24 depicts the effect of different additives (octanethiol and octanedithiol, each at 1%; solvent only, without additive, is displayed for comparison at left) on the power conversion efficiency of solar cells fabricated from either P3HT or poly[3-(ethyl-4-butanoate)thiophene-2,5-diyl] and Phenyl-C60 butyric acid methyl ester cast from chlorobenzene before and after annealing.
Figure 25:
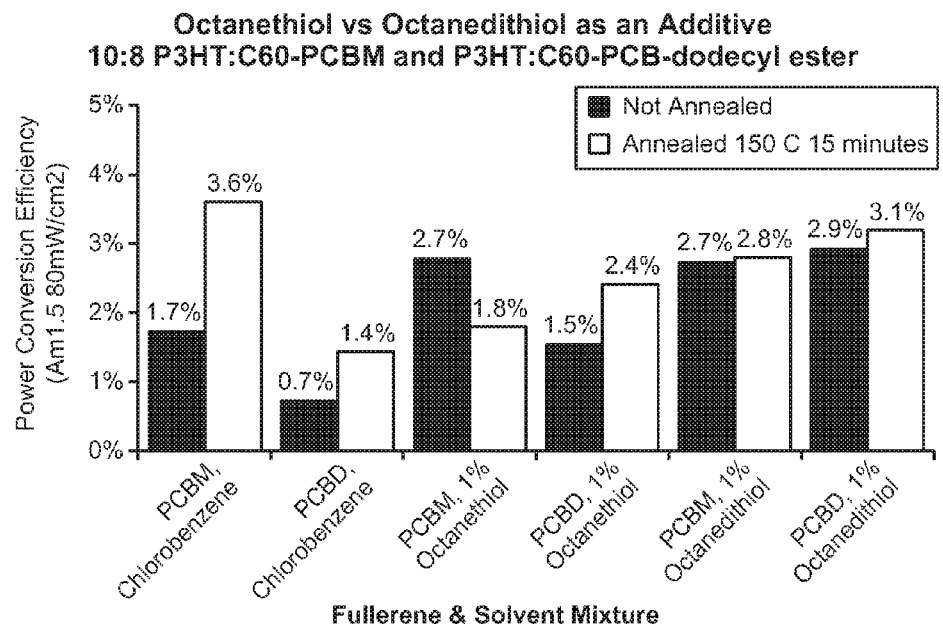
FIG. 25 depicts the effect of different additives (octanethiol and octanedithiol, each at 1%; solvent only, without additive, is displayed for comparison at left) on the power conversion efficiency of solar cells fabricated from P3HT and either Phenyl-C60 butyric acid methyl ester or Phenyl-C60 butyric acid dodecyl ester cast from chlorobenzene before and after annealing.
Figure 26:
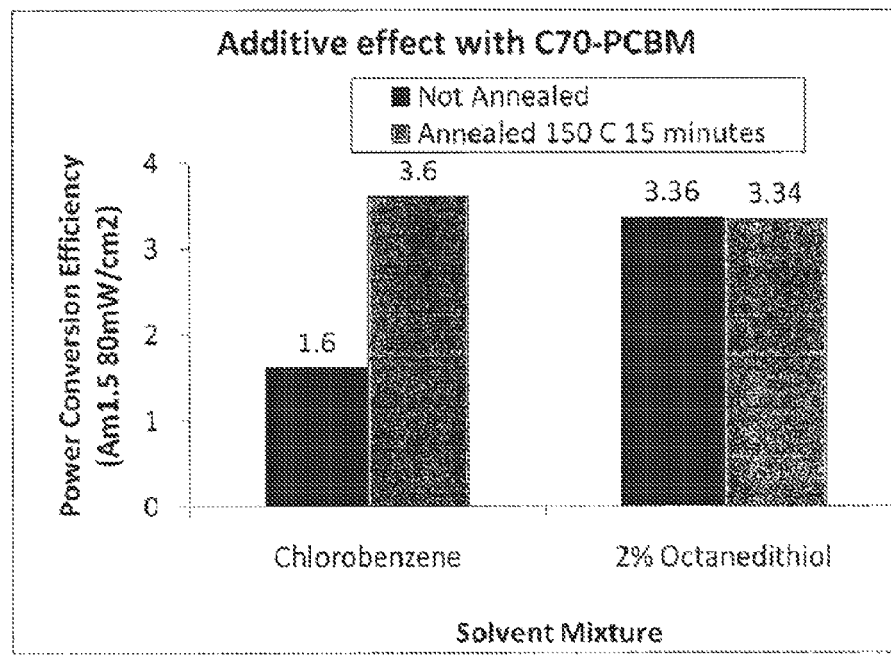
FIG. 26 depicts the effect of 2% octanedithiol (compared to no additive) on the power conversion efficiency of solar cells fabricated from P3HT and Phenyl-C70 butyric acid methyl ester cast from chlorobenzene before and after annealing.
Figure 27:
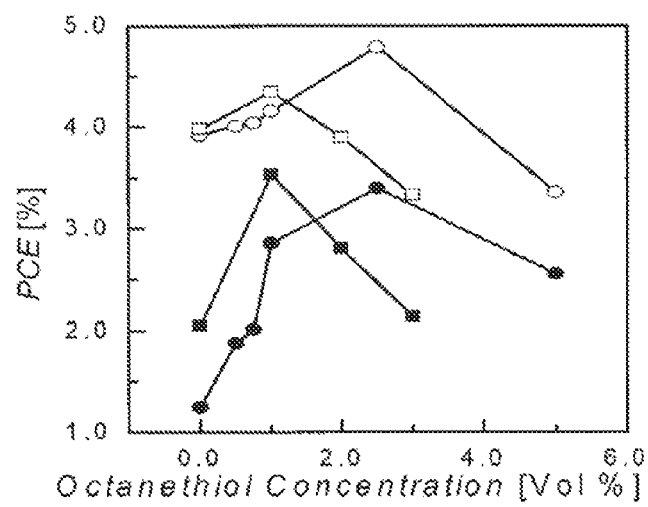
FIG. 27 depicts the change in power conversion efficiency versus octanethiol concentration for P3HT:C60-PCBM films cast from toluene at 120 nm (squares) and 220 nm (circles) before annealing (closed shapes) and after annealing (open shapes).

FIG. 6 shows the transient photocurrent induced in films processed with and without additive. The additive-processed film shows a higher transient photocurrent following the decay from the initial peak. The photoconductive response (R), in terms of photocurrent per incident light power (A/W), was measured using an external field of F=5 KV/cm. Measurements of the transient photoconductivity employed an Auston switch sample configuration (D. H. Auston, *IEEE Journal of Quantum Electronics* 19, 639 (1983)).

Example 5

Power Conversion Efficiency

FIG. 7, FIG. 8, FIG. 9, FIG. 10, FIG. 11, FIG. 12, FIG. 13, FIG. 14, FIG. 15, FIG. 16, FIG. 17, FIG. 18, FIG. 19, FIG. 20, FIG. 21, FIG. 22, FIG. 23, FIG. 24, FIG. 25, FIG. 26, and FIG. 27 display the effect of using various additives according to the invention on the solar cell power conversion efficiency. As displayed in the Figures, power conversion efficiency can be affected by the chemical nature of the additive, the percentage of additive in the casting solution, the solvent used for casting, annealing the film versus not annealing the film, the type of donor or acceptor semiconductor used, and even the spin rate used during spin-casting.

Example 6

Solar Cell Current Density

Figure 28:
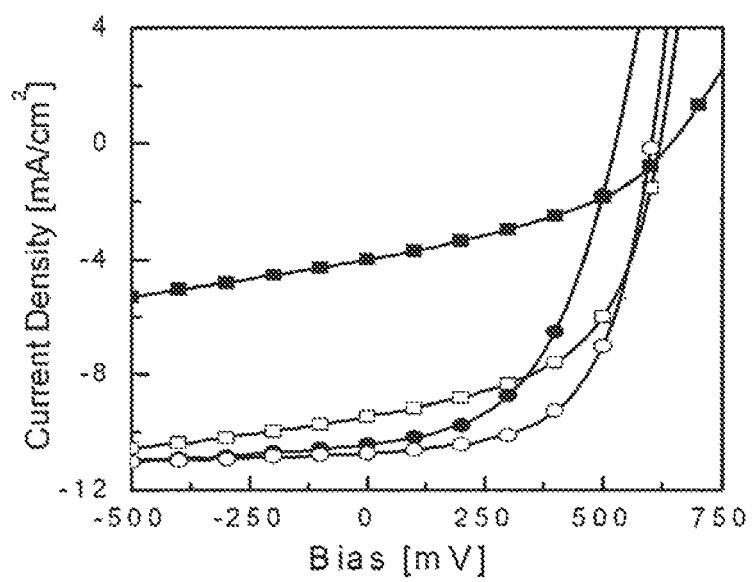
FIG. 28 depicts current-voltage characteristics of solar cells with P3HT/PCBM cast from CB (squares) and CB/2.5% octanethiol (circles) before (solid) and after thermal annealing (open).

FIG. 28 shows the increase in current density at various voltages for P3HT/PCBM films cast from chlorobenzene, with and without 2.5% octanethiol. Use of additive shows an increase in current density similar to that seen with annealing.

Example 7

External Quantum Efficiency

Figure 29:
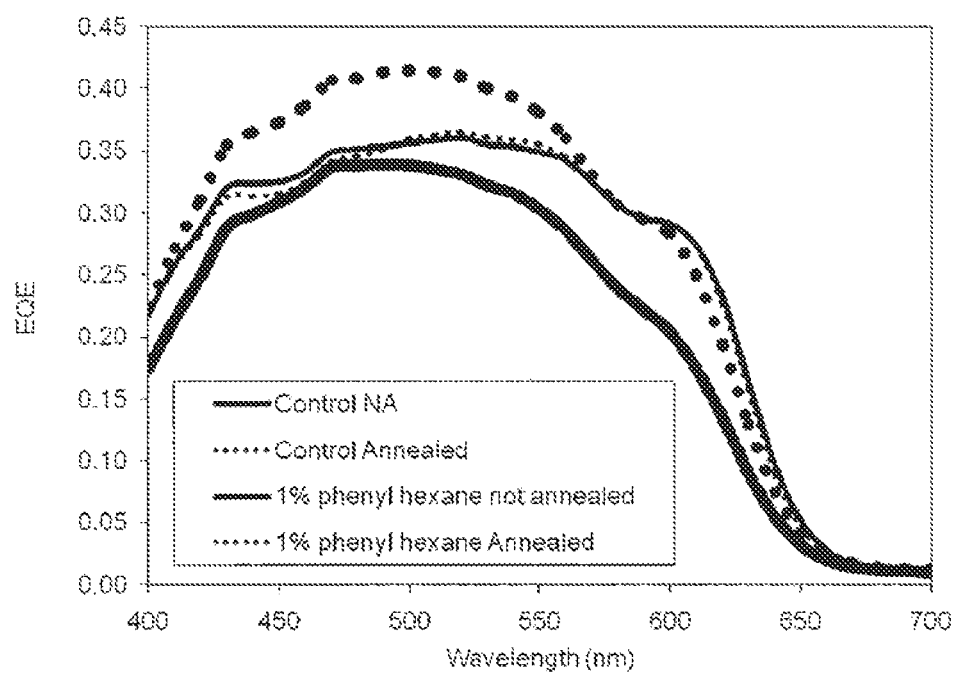
FIG. 29 depicts the effect of 1% phenyl hexane (thin lines) and annealing (dotted lines are annealed) on the external quantum efficiency spectra of P3HT:C60-PCBM devices.

FIG. 29 shows the effect of processing with phenyl hexane on the external quantum efficiency (EQE) of P3HT:C60-PCBM devices. The thick solid line correspond to films cast without additive; the thick dotted line shows EQE after annealing. The thin solid line correspond to films cast with 1% phenyl hexane, while the thin dotted line shows EQE of the additive-processed film after annealing.

Example 8

Carrier Mobility

Figure 31:
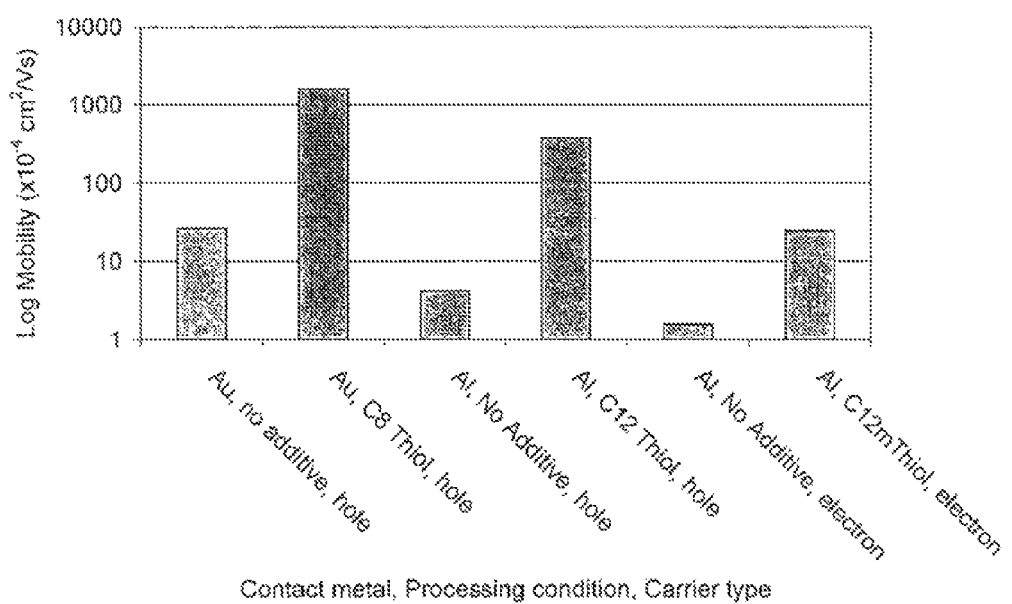
FIG. 31 depicts increased charge carrier mobility in films after processing with 1% thiol additive. From left to right: Au, no additive, holes; Au, octanethiol, holes; Al, no additive, holes; Al, dodecanethiol, holes; Al, no additive, electrons; Al, dodecanethiol, electrons.

FIG. 31 shows the effect of additives on hole and electron mobility when different contact metals are used for the devices. Films contacting both gold and aluminum show dramatically increased hole mobility when processed with additives according to the invention. Additives also increase electron mobility as show with aluminum contact metal.

Example 9

Effects on Absorption

Figure 32:
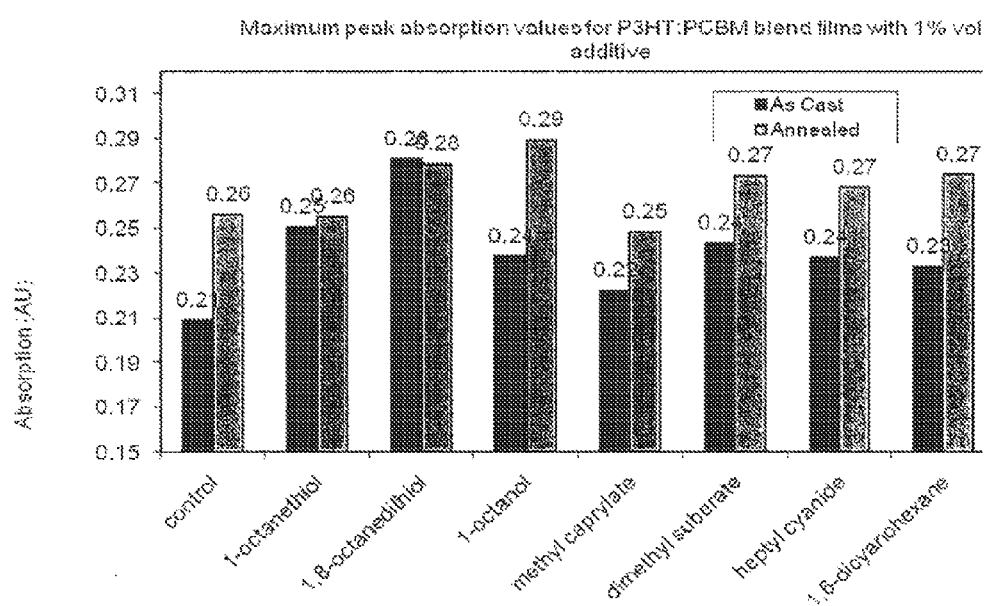
FIG. 32 depicts peak absorption changes before (black bars) and after (shaded bars) annealing for films cast with various additives (at 1%) relative to control. From left to right, the pairs of bars are: control; 1-octanethiol; 1,8-octanedithiol; 1-octanol; methyl caprylate; dimethyl suberate; heptyl cyanide; 1,6-dicyanohexane.
Figure 33:
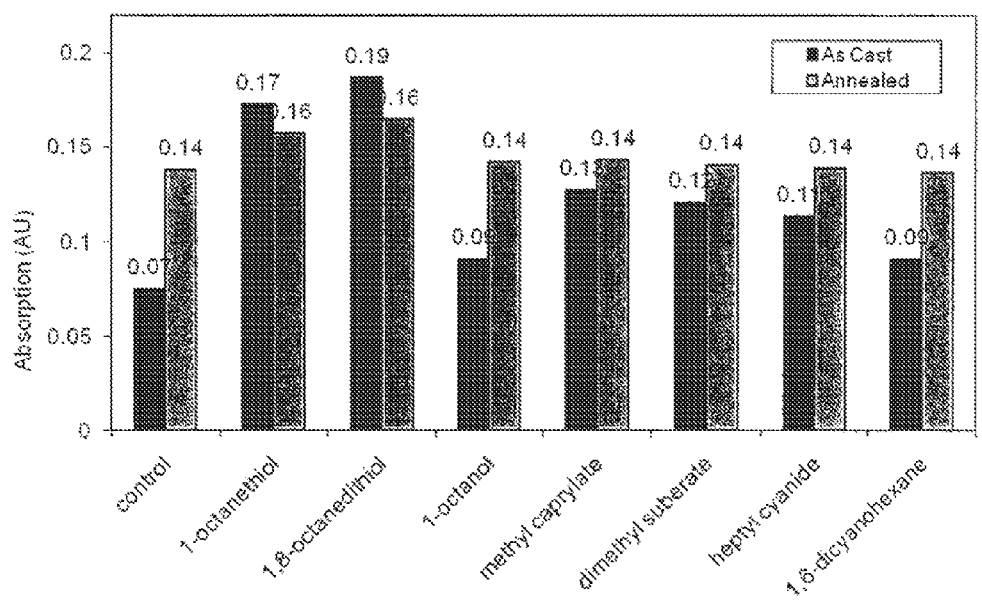
FIG. 33 depicts absorption changes at 600 nm before (black bars) and after (shaded bars) annealing for films cast with various additives (at 1%) relative to control. From left to right, the pairs of bars are: control; 1-octanethiol; 1,8-octanedithiol; 1-octanol; methyl caprylate; dimethyl suberate; heptyl cyanide; 1,6-dicyanohexane.

FIG. 32 and FIG. 33 show the effect of additives on maximum peak absorbance values and absorption values at 600 nm, respectively. Films for optical transmission were spun on glass substrates. The various additives generally increase absorbance of the non-annealed films relative to control (non-additive processed film); some additives also increase absorbance of the annealed films relative to control. The increase in absorption can lead to increased power output per unit input of solar light.

Example 10

Effects on Steady-State Photoconductivity

Figure 34:
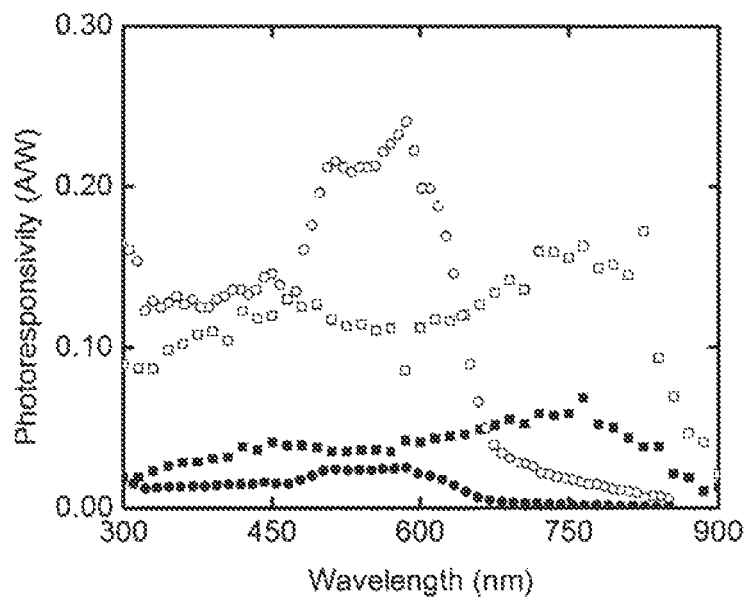
FIG. 34 depicts steady state photoconductivity of P3HT: C60-PCBM (circles) and PCPDTBT:C70-PCBM (squares) processed from chlorobenzene (solid shapes) and with 1,8-octanedithiol (open shapes).

FIG. 34 shows steady state photoconductivity of P3HT:C60-PCBM (circles) and PCPDTBT:C70-PCBM (squares) processed from chlorobenzene (solid shapes) and with thiol (open shapes). The additive-processed films show dramatic increases in photoresponsivity at wavelengths below 600 nm, as compared to films processed without additive. The photoconductive response (R), in terms of photocurrent per incident light power (A/W), was measured using an external field of F=5 KV/cm. Measurements of the steady-state photoconductivity employed a standard modulation technique (C. H. Lee et al., *Phys. Rev. B* 48(20) 15425 (1993)).

Example 11

Fabrication and Evaluation of Cells for Alkyl Dithiol Experiments

Photovoltaic cells were fabricated by spin-casting the active bulk heterojunction layer onto a 60 nm layer of H. C. Stark Baytron P PEDOT:PSS on Corning 1737 AMLCD glass patterned with 140 nm of indium tin oxide (ITO) by Thin Film Devices Inc. A 100 nm thick aluminum cathode was deposited (area 17 mm$^2$) by thermal evaporation with no heating of the sample either before or after deposition. Unless otherwise stated, the bulk heterojunction layer was spin cast at 1200 RPM from a solution of 2.4 mg/mL octanedithiol in CB containing 10 mg/mL PCPDTBT and 20 mg/mL $C_{71}$-PCBM. PCPDTBT was obtained from Konarka Inc. and the $C_{71}$-PCBM was purchased from Nano-C Inc. Atomic force microscopy (AFM) showed that the active layers were approximately 110 nm thick regardless of alkanedithiol concentration in the solution.

Device efficiencies were measured with a 150 Watt Newport-Oriel AM 1.5 G light source operating at 80 mW/cm$^2$ and independently cross-checked using a 300 Watt AM 1.5 G source operating at 100 mW/cm$^2$ for verification. Solar simulator illumination intensity was measured using a standard silicon photovoltaic with a protective KG5 filter calibrated by the National Renewable Energy Laboratory (NREL). Many of the most efficient devices were fabricated independently by different individuals in two separate laboratories and cross-checked under the two different illumination sources. Incident photon conversion efficiency (IPCE) spectra measurements were made with a 250 W Xe source, a McPherson EU-700-56 monochromator, optical chopper and lock-in amplifier, and a NIST traceable silicon photodiode for monochromatic power density calibration.

Photoconductive devices were fabricated by spin casting on alumina substrates as described previously. For steady-state photoconductivity measurements, the standard modulation technique was used; for transient photoconductivity, an Auston switch configuration was used. TFT devices were fabricated and tested as described previously with in a bottom contact geometry with gold electrodes. AFM images were taken on a Veeco multimode AFM with nanoscope Ma controller. UV-Vis absorption spectroscopy was measured on a Shimadzu 2401 diode array spectrometer. XPS spectra were recorded on a Kratos Axis Ultra XPS system with a base pressure of $1 \times 10^{-10}$ mbar using a monochromated Al Kα X-ray source. XPS survey scans were taken at 160 pass energy and high resolution scans were taken at 10 pass energy. Data analysis was done with the CASA XPS software package.

Example 12

Results of Alkyldithiol Experiments

Figure 35:
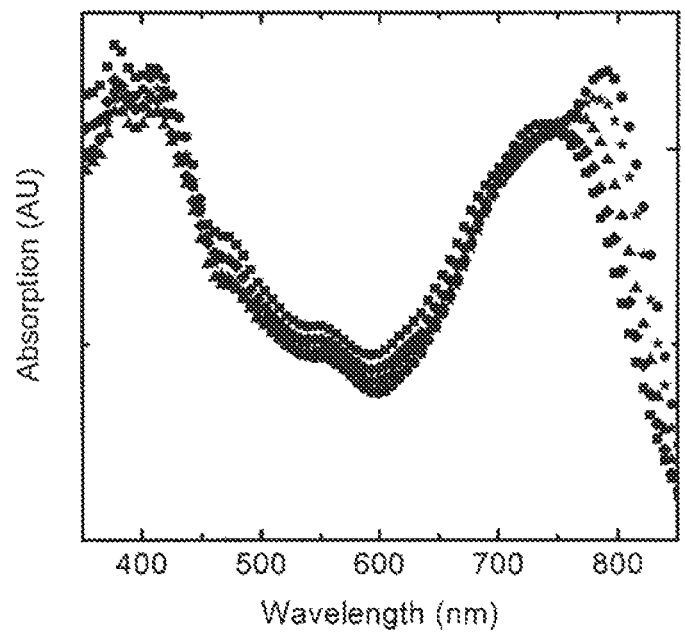
FIG. 35 depicts UV-VIS absorption spectra of PCPDTBT: $C_{71}$-PCBM films cast using different solution additives. The spectral response indicates a red-shift from a pure PCPDTBT: $C_{71}$-PCBM film (squares) to films cast from chlorobenzene containing 2.4 mg/mL 1,3-propanedithiol (diamonds), 1,4-butanedithiol (triangles), 1,6-hexanedithiol (stars) and 1,8-octanedithiol (circles).

FIG. 35 shows the shift in the film absorption caused by adding different alkanedithiols to the PCPDTBT:$C_{71}$-PCBM solution in chlorobenzene (CB) prior to spin casting. The largest change is observed with the addition of 2.4 mg/mL of 1,8-octanedithiol into the CB; the film absorption peak redshifts 41 nm to 800 nm. Such a shift to lower energies and the emergence of structure on the absorption peak associated with the π-π* transition when films are processed with alkanedithiols indicates that the PCPDTBT chains interact more strongly and that there is improved local structural order compared with films processed from pure CB. Analysis by Fourier-Transform Infrared (FTIR) and Raman spectroscopies yielded no resolvable thiol signals after drying in a low vacuum (~$10^{-3}$ torr) for 10 minutes at room temperature (when FTIR was measured on wet films prior to exposure to a vacuum, a small thiol peak can be observed). X-ray photoelectron spectroscopy (XPS) averaged over several samples with multiple scans per sample indicates no significant content of dithiol, certainly less than 0.1 dithiol per PCPDTBT repeat unit after thorough drying in vacuum.

Figure 36:
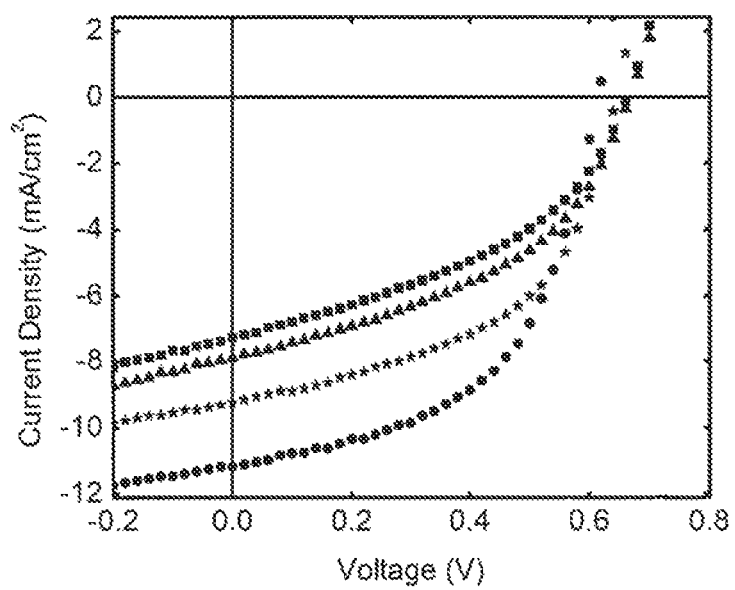
FIG. 36 depicts device IV characteristics, as current density vs. voltage curves (under simulated AM1.5 G radiation at 80 mW/cm$^2$) for a series of PCPDTBT:$C_{71}$-PCBM solar cells. The PCPDTBT:$C_{71}$-PCBM films were cast at 1200 RPM from chlorobenzene with no additive (squares) and chlorobenzene containing 2.4 mg/mL butanedithiol (triangles), hexanedithiol (stars), or octanedithiol (circles).

The current voltage characteristics obtained under 80 mW/cm$^2$ for devices processed from CB and from CB with 2.4 mg/mL by volume alkanedithiols with different chain lengths are shown in FIG. 36. From the I-V curves in FIG. 36, it is apparent that processing with 1,8-octanedithiol increases both $I_{sc}$ and FF.

Device optimization involved over 1000 devices made from over 250 independently prepared PCPDTBT:C$_{71}$-PCBM films; optimum photovoltaic efficiencies between 5.2% and 5.8% were obtained. The most efficient devices comprised a polymer/fullerene ratio between 1:2 and 1:3, a spin speed between 1200 and 1600 RPM, a polymer concentration of between 0.8 and 1% by weight, and a 1,8-octanedithiol concentration of between 1.75 and 2.5 mg/mL. The most repeatable series of high efficiency devices had an average power conversion efficiency of 5.5% under 100 mW/cm$^2$, with short circuit current $I_{sc}$=16.2 mA/cm$^2$, FF=0.55, and open circuit voltage $V_\partial$=0.62 V. More than 40 devices gave efficiencies over 5.2%. Nevertheless, as implied by the measured FF=0.55, there are significant improvements to be made that could lead to more efficient solar energy conversion.

Figure 37:
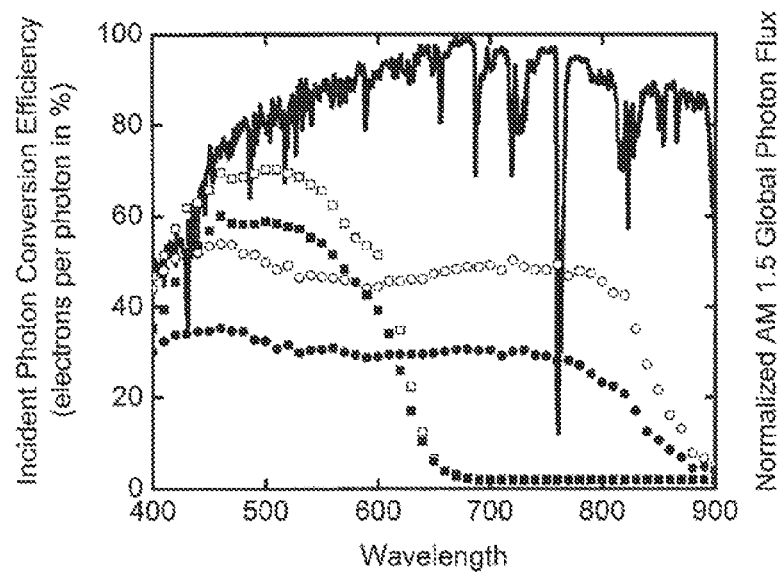
FIG. 37 depicts the incident photon conversion efficiency of various solar cells. The top panel (FIG. 37A) depicts IPCE spectra of polymer bulk heterojunction solar cells composed of P3HT:$C_{61}$-PCBM before (solid squares) and after (open squares) annealing, and PCPDTBT:$C_{71}$-PCBM with (open circles) and without (closed circles) the use of 1,8-octanedithiol. The AM 1.5 global reference spectrum is shown for reference (line). The bottom panel (FIG. 37B) depicts current voltage characteristics of the same PCPDTBT devices used for the IPCE measurements, processed with (solid) and without (dotted line) 1,8-octanedithiol under simulated 100 mW/cm$^2$ AM 1.5 G illumination; $I_{sc}$=16.2 mA/cm$^2$, FF=0.55, and $V_{oc}$=0.62 V.
Figure 37:
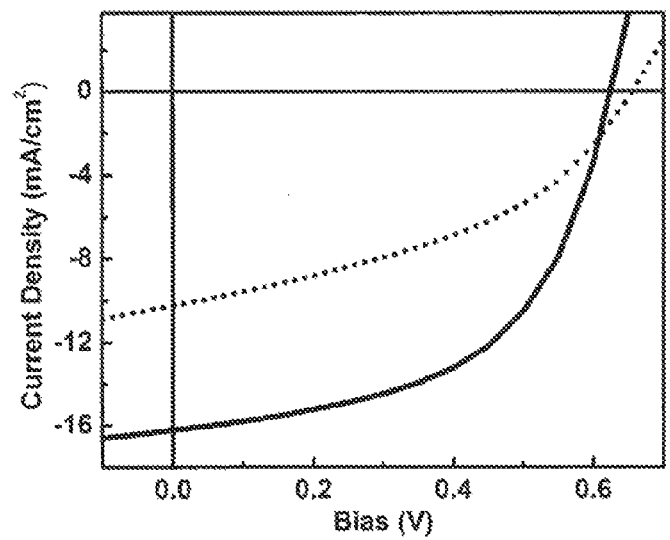

As shown in FIG. 37, the IPCE spectra of photovoltaic cells made with films cast from CB compare very well with those previously reported for PCPDTBT:C$_{71}$-PCBM films formed by "doctor blade" deposition from ortho-dichlorobenzene. Devices processed with 1,8-octanedithiol increased the IPCE by a factor of approximately 1.6 between 400 nm and 800 nm over devices processed without the additive. The integrated IPCE and the $I_{sc}$ measured on the same device, also shown in FIG. 37, agree to within approximately 5%. Note that since the IPCE for P3HT:C$_{61}$-PCBM is limited to a narrower fraction of the solar spectrum, higher efficiencies are anticipated for the PCPDTBT:C$_{71}$-PCBM devices.

To determine the effect of the alkanedithiol processing on carrier transport, the steady-state and transient photoconductivity was measured in films fabricated with and without processing with the alkanedithiol additive. The steady-state responsivity at E=20 KV/cm (E is the applied electric field) and the magnitude of the current response in the transient photoconductivity from films processed using 1,8-octanedithiol are each larger than the values obtained from films processed without dithiols by approximately a factor of two. The measured current in the transient data indicates an increase in the number of extracted mobile carriers, and the waveform indicates an additional increase in the carrier lifetime. As in the absorption, a red-shift is observed in the peak photoconductivity from 765 nm to 825 nm with the use of alkanedithiols.

Changes in the surface topography of films cast from pure chlorobenzene (CB) and from CB with 2.4 mg/mL of the alkanedithiols were examined by AFM. Comparison of the data (not shown) obtained from films processed with 1,4-butanedithiol, 1,6-hexanedithiol, 1,8-octanedithiol or 1,9-nonanedithiol indicate that approximately six methylene units are required for the alkanedithiol to have an appreciable effect on the morphology; however, as seen in FIG. 36, devices made from films cast with 1,4-butanedithiol showed improvement in current-voltage characteristics. Corresponding changes in the internal nano-structure were also seen by Transmission Electron Microscopy (TEM). The strong dependence of the absorption, the morphology and the device performance on the alkyl chain length implies that processing with dithiols influences the physical interactions between the polymer chains and/or between the polymer and fullerene phases.

The novel methods described herein provide operationally simple and versatile tools for tailoring of the heterojunction solar cell morphology in systems where thermal annealing is not effective. This approach works even on a system in which polymer crystallinity is not observed. Based on calculations by Brabec et. al. on photovoltaic cells fabricated from PCPDTBT:C$_{71}$-PCBM, further optimization of morphology and equalization of ambipolar transport could lead to further increases in power conversion efficiency. This expectation is fully consistent with the Incident Photon Conversion Efficiency data shown in FIG. 37; there is a clear opportunity to increase the IPCE.

The disclosures of all publications, patents, patent applications and published patent applications referred to herein by an identifying citation are hereby incorporated herein by reference in their entirety.

Although the foregoing invention has been described in some detail by way of illustration and example for purposes of clarity of understanding, it is apparent to those skilled in the art that certain changes and modifications will be practiced. Therefore, the description and examples should not be construed as limiting the scope of the invention.

What is claimed is:

1. An electronic device comprising a first electrode, an organic semiconductor film having a first side and a second side, where the first side of the organic semiconductor film contacts the first electrode and where the film is formed by adding an amount of one or more low molecular weight alkyl-containing molecules to a solution used to form the organic semiconductor film, and a second electrode contacting the second side of the organic semiconductor film, wherein the one or more low molecular weight alkyl-containing molecules are selected from C$_4$-C$_{20}$ alkanes, C$_4$-C$_{16}$ alcohols, and C$_4$-C$_{16}$ thiols.

2. The device of claim 1, wherein the organic semiconductor film comprises a conjugated polymer film.

3. The device of claim 1, wherein the electronic device is a solar cell, photovoltaic cell, photodetector, photodiode, or phototransistor.

4. The device of claim 1, wherein the first electrode is a high work function material.

5. The device of claim 1, wherein the second electrode is a low work function material.

6. An electronic device comprising a first electrode, an organic semiconductor film having a first side and a second side, where the first side of the organic semiconductor film contacts the first electrode and where the film is formed by adding an amount of one or more low molecular weight alkyl-containing molecules to a solution used to form the organic semiconductor film, and a second electrode contacting the second side of the organic semiconductor film, wherein the low molecular weight alkyl-containing molecules are selected from the group consisting of C$_1$-C$_{20}$ alkanes substituted with one or more substituents selected from aldehyde, dioxo, hydroxy, thiol, thioalkyl, amine, amide, thioether, and epoxide groups, with the proviso that if a thiol or hydroxy group substituent is present, at least one independently chosen additional substituent must also be present.

7. The device of claim 6, wherein the organic semiconductor film comprises a conjugated polymer film.

8. The device of claim 6, wherein the electronic device is a solar cell, photovoltaic cell, photodetector, photodiode, or phototransistor.

9. The device of claim 6, wherein the first electrode is a high work function material.

10. The device of claim 6, wherein the second electrode is a low work function material.

\* \* \* \* \*